(12) United States Patent
Kim

(10) Patent No.: US 10,868,381 B2
(45) Date of Patent: Dec. 15, 2020

(54) CONNECTOR AND DISPLAY DEVICE INCLUDING SAME

(71) Applicant: LG Display Co., Ltd., Seoul (KR)

(72) Inventor: Geunyoung Kim, Gyeongsangnam-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/222,745

(22) Filed: Dec. 17, 2018

(65) Prior Publication Data

US 2019/0199025 A1    Jun. 27, 2019

(30) Foreign Application Priority Data

Dec. 27, 2017 (KR) .................. 10-2017-0181193

(51) Int. Cl.
| | | |
|---|---|---|
| *H01R 13/62* | (2006.01) | |
| *H01R 12/79* | (2011.01) | |
| *H01R 12/70* | (2011.01) | |
| *H01B 7/08* | (2006.01) | |
| *H05K 1/14* | (2006.01) | |

(Continued)

(52) U.S. Cl.
CPC .............. *H01R 12/79* (2013.01); *H01B 7/04* (2013.01); *H01B 7/08* (2013.01); *H01R 12/7011* (2013.01); *H01R 12/88* (2013.01); *H05K 1/115* (2013.01); *H05K 1/118* (2013.01); *H05K 1/144* (2013.01); *H01R 12/7076* (2013.01); *H01R 13/6461* (2013.01); *H05K 1/0245* (2013.01); *H05K 2201/041* (2013.01); *H05K 2201/09409* (2013.01); *H05K 2201/09709* (2013.01); *H05K 2201/09781* (2013.01); *H05K 2201/10128* (2013.01); *H05K 2201/10356* (2013.01)

(58) Field of Classification Search
CPC ............. H01F 27/3276; H01F 27/3241; H01F 27/3297; H05K 1/028; G02F 1/1368; H01R 12/79; H01R 12/7011
USPC ......................................................... 439/495
See application file for complete search history.

(56) References Cited

U.S. PATENT DOCUMENTS

| | | | |
|---|---|---|---|
| 6,352,442 B1 * | 3/2002 | Kudo ..................... | H01R 12/88 439/260 |
| 7,172,446 B1 * | 2/2007 | Hashimoto .......... | H01R 12/774 439/260 |

(Continued)

FOREIGN PATENT DOCUMENTS

| | | |
|---|---|---|
| CN | 100345342 C | 10/2007 |
| CN | 104835416 A | 8/2015 |

(Continued)

*Primary Examiner* — Hae Moon Hyeon
(74) *Attorney, Agent, or Firm* — Seed Intellectual Property Law Group LLP

(57) ABSTRACT

The present disclosure provides a device that includes a cable. A first cable pin and a second cable pin are spaced apart from one another in a first pin region on a first face of the film. A third cable pin and a fourth cable pin are spaced apart from one another in a second pin region on a second face of the film that is opposite the first face. A first cable signal line on the first face of the film is connected to the first cable pin, and a second cable signal line on the first face of the film is connected to the second cable pin. A third cable signal line on the second face of the film is connected to the third cable pin, and a fourth cable signal line on the second face of the film is connected to the fourth cable pin.

17 Claims, 19 Drawing Sheets

(51) Int. Cl.
*H01B 7/04* (2006.01)
*H05K 1/11* (2006.01)
*H01R 12/88* (2011.01)
*H01R 13/6461* (2011.01)
*H05K 1/02* (2006.01)

(56) References Cited

U.S. PATENT DOCUMENTS

| | | | | |
|---|---|---|---|---|
| 7,467,962 | B2 * | 12/2008 | Sunaga | H01R 12/79 |
| | | | | 439/260 |
| 7,530,831 | B2 * | 5/2009 | Nishimatsu | H01R 12/79 |
| | | | | 439/260 |
| 9,535,302 | B2 * | 1/2017 | Lee | G02F 1/1368 |
| 10,572,040 | B2 * | 2/2020 | Jin | G06F 3/0412 |
| 2004/0023551 | A1 * | 2/2004 | Suzuki | H01R 12/79 |
| | | | | 439/495 |
| 2006/0001792 | A1 * | 1/2006 | Choi | H01L 27/3223 |
| | | | | 349/54 |
| 2009/0298319 | A1 * | 12/2009 | Takahashi | H01R 4/028 |
| | | | | 439/329 |
| 2015/0228706 | A1 * | 8/2015 | Lee | G02F 1/13452 |
| | | | | 257/88 |
| 2017/0192575 | A1 * | 7/2017 | Jin | G06F 3/0412 |

FOREIGN PATENT DOCUMENTS

| | | |
|---|---|---|
| CN | 106325608 A | 1/2017 |
| CN | 107111999 A | 8/2017 |
| CN | 107204346 A | 9/2017 |
| EP | 3 040 770 A1 | 6/2019 |
| JP | 2002-117920 A | 4/2002 |
| JP | 2004-206987 A | 7/2004 |
| JP | 2004-221067 A | 8/2004 |
| JP | 2008-233881 A | 10/2008 |
| JP | 2012-182409 A | 9/2012 |

* cited by examiner

CONNECTOR AND DISPLAY DEVICE INCLUDING SAME

CROSS REFERENCE TO RELATED APPLICATION

This application claims priority from Korean Patent Application No. 10-2017-0181193, filed Dec. 27, 2017, which is hereby incorporated by reference for all purposes as if fully set forth herein.

BACKGROUND

Technical Field

Embodiments of the present disclosure relate to a cable, a connector, and a printed circuit board and a display device that use the cable and the connector.

Description of the Related Art

As society develops into an information-oriented society, the demand for display devices for displaying an image is increasing in various forms, and various types of display devices, such as a Liquid Crystal Display (LCD) device and an Organic Light-Emitting Diode (OLED) display device, are being utilized.

Among the above-mentioned display devices, the OLED display device, which is a self-luminous device, has recently been spotlighted because the OLED display device is excellent in response speed, viewing angle, color reproducibility, and the like, and can be implemented so as to be thin.

In a display device, various driving units and controllers, which are connected to the display panel, are disposed on respective printed circuit boards, and the respective printed circuit boards are connected via cables so as to be supplied with signals and voltages.

However, the cables and printed circuit boards include pins that are in contact with each other to be aligned with each other and transmit signals, and signal wirings that are connected to the pins. When transmitting signals at high speed, two adjacent lines transmit signals may have different polarities, and when two lines are short circuited, a circuit connected to the cable may be damaged. Therefore, each of the cable and the printed circuit board has a wiring formed using a set process margin. However, due to a difference in size between the cable and the printed circuit board, a difference exists in the process margins, which are respectively set for the cable and the printed circuit board. Particularly, a process margin set in a printed circuit board employed in a large-sized display device is larger than a process margin set in a cable. Then, because the pins of the cable should be aligned with the pins of the printed circuit board, there is a limit to which the width of the cable can be narrowed. In addition, when the cable is long, a transmission rate may deteriorate, causing attenuation of signals or the like due to the line resistance of the cable or the like. Due to the increase in the cable width, the shortest connection cannot be made between the cable and the printed circuit board, which also increases manufacturing costs due to the increase in the length of the cable.

BRIEF SUMMARY

In various embodiments, the present disclosure provides a cable and a connector which enable high-speed signal transmission, and a printed circuit board and a display device which use the cable and the connector.

In various embodiments, the present disclosure provides a cable and a connector, which can be easily fastened, and a printed circuit board and a display device which use the cable and the connector.

In one or more embodiments of the present disclosure, a display device is provided that includes a cable, the cable including: a film having a first pin region and a first dummy pin region adjacent to one another on a first face of the film, and a second pin region and a second dummy pin region adjacent to one another on a second face of the film opposite the first face, the second pin region overlapping the first dummy pin region and the second dummy pin region overlapping the first pin region; a first cable pin and a second cable pin spaced apart from one another in the first pin region; a third cable pin and a fourth cable pin spaced apart from one another in the second pin region; a first cable signal line on the first face of the film and connected to the first cable pin, and a second cable signal line on the first face of the film and connected to the second cable pin; and a third cable signal line on the second face of the film and connected to the third cable pin, and a fourth cable signal line on the second face of the film and connected to the fourth cable pin.

In another embodiment, the present disclosure provides a connector including: a connector body; a first electrical contact extending from the connector body and including a first protrusion that protrudes downwards; a second electrical contact extending from the connector body, the second electrical contact being adjacent to the first electrical contact, the second electrical contact including a second protrusion that protrudes downwards and is spaced apart from the connector body along a first direction by a distance that is less than a distance between the first protrusion and the connector body along the first direction; a third electrical contact extending from the connector body and including a third protrusion that protrudes upwards at a position corresponding to a position of the first protrusion; and a fourth electrical contact extending from the connector body, the fourth electrical contact being adjacent to the third electrical contact, the fourth electrical contact including a fourth protrusion that protrudes upwards at a position corresponding to a position of the second protrusion.

In another embodiment, the present disclosure provides a printed circuit board including a printed circuit board body and a connector disposed on an upper face of the printed circuit board body. The connector may include: a connector body; a first electrical contact extending in a first direction from the connector body and including a first protrusion that protrudes downwards toward the upper face of the printed circuit board body; a second electrical contact extending in the first direction from the connector body, the second electrical contact spaced apart from the first electrical contact in a second direction that is transverse to the first direction, the second electrical contact including a second protrusion that protrudes downwards toward the upper face of the printed circuit board body and is spaced apart from the connector body in the first direction by a distance that is less than a distance between the first protrusion and the connector body in the first direction; a third electrical contact extending in the first direction from the connector body and including a third protrusion that protrudes upwards at a position that corresponds to a position of the first protrusion; and a fourth electrical contact on extending in the first direction from the connector body, the fourth electrical contact spaced apart from the third electrical contact in the first second direction, the fourth electrical contact including a fourth protrusion that protrudes upwards at a position that corresponds to a position of the second protrusion.

In another embodiment, the present disclosure provides a display device including: a display panel; a first source printed circuit board disposed on a first side of the display panel; a second source printed circuit board disposed on the first side of the display panel; a first integrated circuit disposed on a first base film that is connected to the display panel and the first source printed circuit board; a second integrated circuit disposed on a second base film that is connected to the display panel and the second source printed circuit board; a bridge printed circuit board configured to supply a signal to the first source printed circuit board. The bridge printed circuit board and the first source printed circuit board are connected to each other by a first cable, and the first source printed circuit board and the second source printed circuit board are connected to each other by a second cable. At least one of the first cable and the second cable may include: a film having a first pin region and a first dummy pin region adjacent to one another on a first face of the film, and a second pin region and a second dummy pin region adjacent to one another on a second face of the film opposite the first face, the second pin region overlapping the first dummy pin region and the second dummy pin region overlapping the first pin region; a first cable pin and a second cable pin spaced apart from one another in the first pin region; a third cable pin and a fourth cable pin spaced apart from one another in the second pin region; a first wiring layer on the first face of the film, the first wiring layer including a first wiring connected to the first cable pin, and a second wiring connected to the second cable pin; and a second wiring layer on the second face of the film, the second wiring layer including a third wiring connected to the third cable pin, and a fourth wiring connected to the fourth cable pin.

According to embodiments of the present disclosure, it is possible to provide a cable and a connector, which enable high-speed signal transmission, and a display device that uses the cable and the connector.

According to the embodiments of the present disclosure, it is possible to provide a cable and a connector that can be easily fastened and a display device that uses the cable and the connector.

BRIEF DESCRIPTION OF THE SEVERAL VIEWS OF THE DRAWINGS

The above and other aspects, features and advantages of the present disclosure will be more apparent from the following detailed description taken in conjunction with the accompanying drawings, in which.

DETAILED DESCRIPTION

Figure 1:
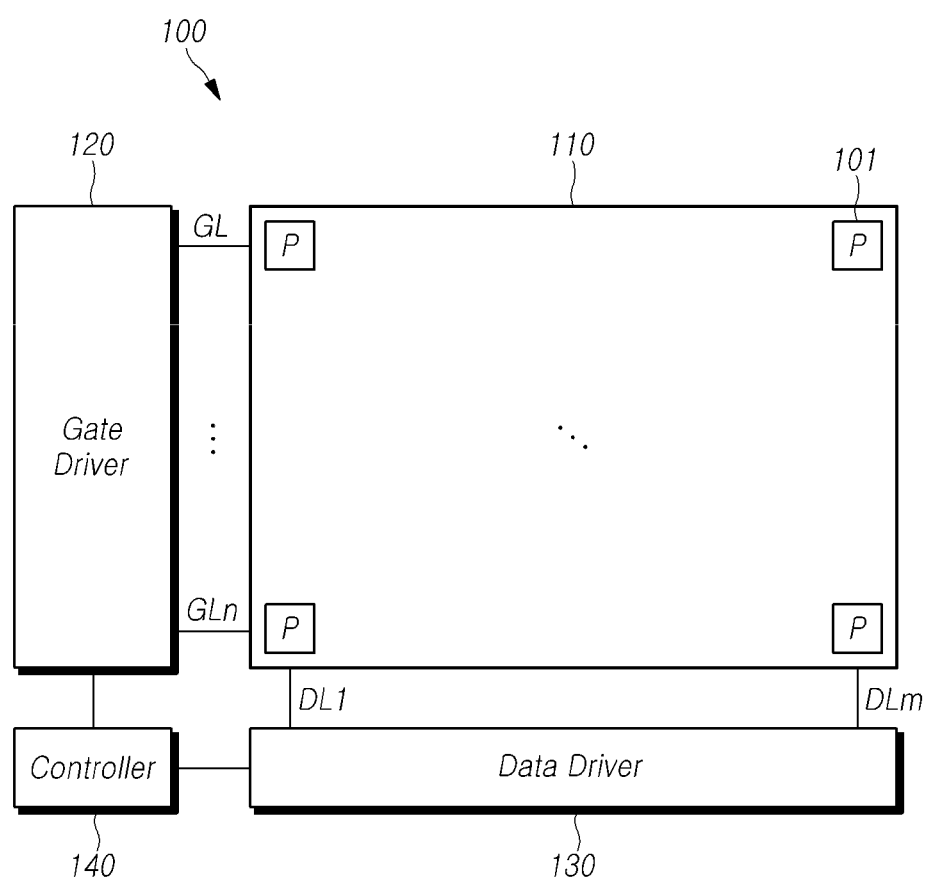
FIG. 1 is a structural view illustrating an example of a display device according to embodiments of the present disclosure.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but is used merely to distinguish the corresponding component from other component(s). In the case that it is described that a certain structural element "is connected to," "is coupled to," or "is in contact with" another structural element, it should be interpreted that another structural element may "be connected to," "be coupled to," or "be in contact with" the structural elements as well as that the certain structural element is directly connected to or is in direct contact with another structural element.

Similarly, positional terms such as upper, lower, left, right, above, below, front, rear, or the like may be used herein when describing components or features of the present disclosure. Such terms are used only to distinguish a relative position of one component or feature with respect to another component or feature, and are not used to define any particular orientation of the various embodiments of the present disclosure. For example, a first component may be described as being on an upper face of a structure, and a second component may be described as being on a lower face of the structure; however, it should be readily appreciated that depending on an orientation of the structure, the second component may be on the upper face while the first component may be on the lower face.

FIG. 1 is a structural view illustrating an example of a display device according to embodiments of the present disclosure.

Referring to FIG. 1, a display device 100 may include a display panel 110, a gate driver 120, a data driver 130, and a controller 140.

The display panel 110 may have a plurality of pixels 101, which are disposed in a region where a plurality of gate lines GL1 to GLn and a plurality of data lines DL1 to DLm intersect each other. The term "intersect" is used herein in its broadest sense to include within the meaning that one element crosses over or overlaps another element, and does not necessarily require that the two elements contact each other. For example, the gate lines GL1 to GLn and the data lines DL1 to DLm may overlap, and thus intersect with each other, but may be physically separated from one another, for example, by one or more layers or elements provided there between. It also includes within its meaning, in some embodiments, that the lines or elements can contact each other. Each pixel 101 may include an organic light-emitting diode (OLED) and a pixel circuit configured to supply a driving current to the OLED. The pixel circuit may receive a data signal flowing in the data lines DL1 to DLm in response to a gate signal transmitted through a gate line, generates a driving current and supplies the driving current to the OLED. In addition, the display panel 110 may be driven by receiving a plurality of voltages.

The gate driver 120 is connected to the plurality of gate lines GL1 to GLn and is capable of transmitting gate signals to the gate lines GL1 to GLn. Here, the number of gate drivers 120 is illustrated as one. However, the present disclosure is not limited thereto, and a plurality of gate drivers 120 may be provided.

The data driver 130 is connected to the plurality of data lines DL1 to DLm and is capable of transmitting data signals to the data lines DL1 to DLm. The number of data drivers 130 is illustrated as one. However, the present disclosure is not limited thereto, and a plurality of data drivers 130 may be provided. In addition, the number of data drivers 130 may be determined based on the size and resolution of the display panel 110.

In addition, the gate driver 120 and the data driver 130 may each include a plurality of integrated circuits.

The controller 140 is capable of controlling the gate driver 120 and the data driver 130. The controller 140 may transmit a clock signal and a synchronization signal to the gate driver 120 and the data driver 130. In addition, the controller 140 may transmit a video signal to the data driver 130. The signals transmitted to the gate driver 120 and the data driver 130 from the controller 140 are not limited to those described above. In addition, the controller 140 is capable of transmitting signals to be transmitted to the gate driver 120 and the data driver 130 at a high speed. The high speed may mean that signals are transmitted at a rate of not less than 1 gigabit per second (Gbps). However, the present disclosure is not limited thereto. In addition, the signals transmitted at high speed may be differential signals. However, the present disclosure is not limited thereto.

Figure 2A:
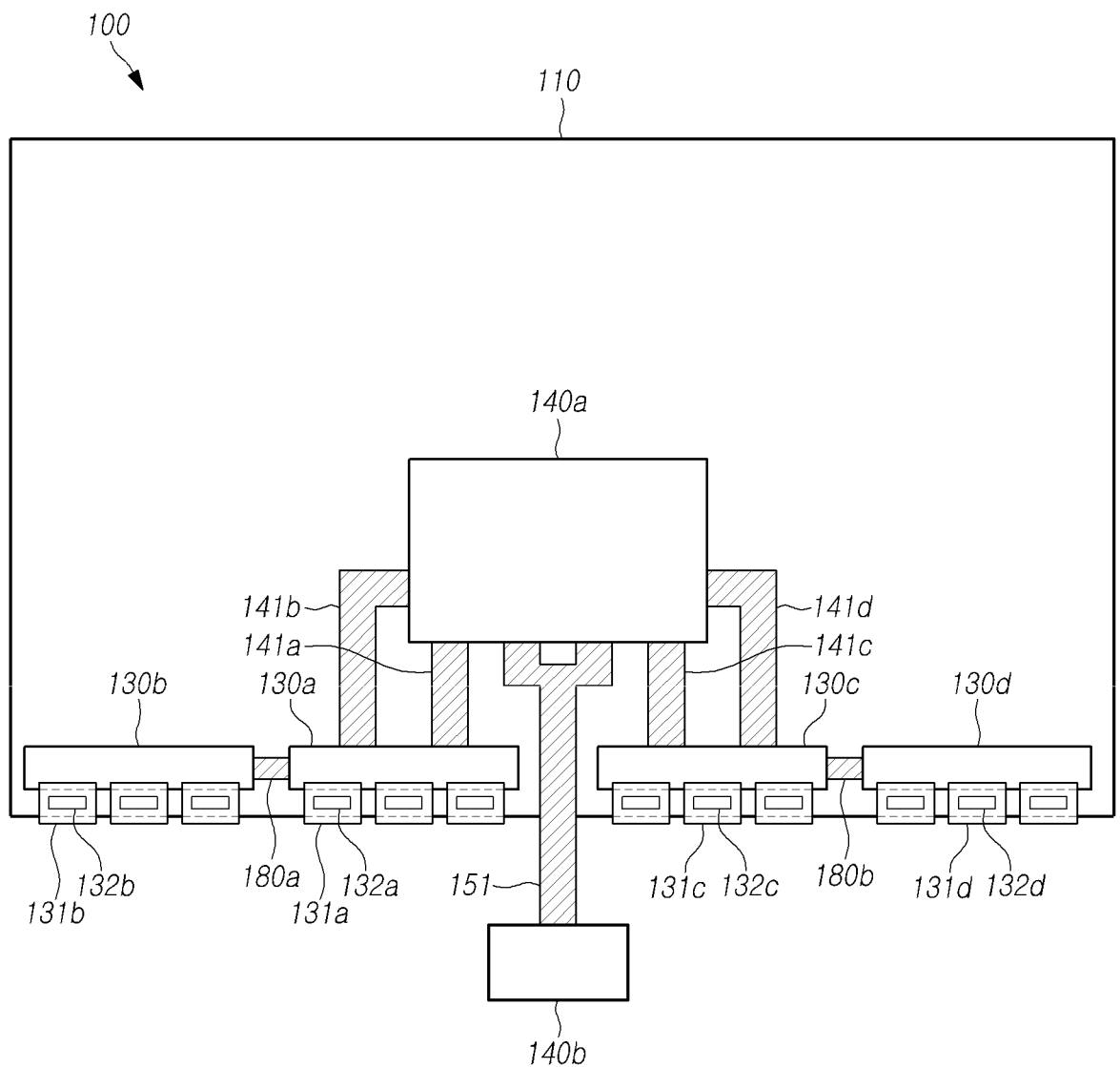
FIG. 2A is a plan view illustrating an example of a rear side of a display device according to embodiments of the present disclosure.
Figure 2B:
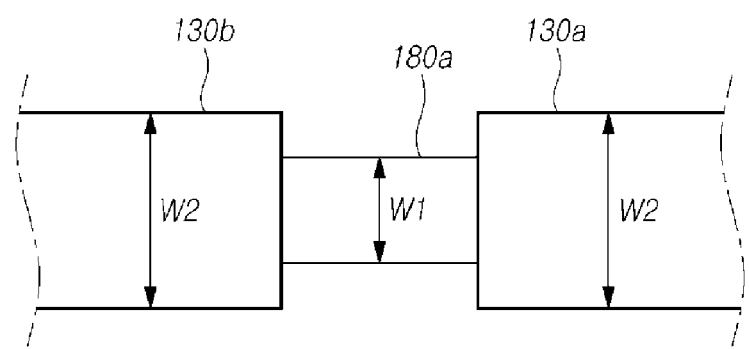
FIG. 2B is an enlarged view illustrating a connection relationship between source printed circuit boards illustrated in FIG. 2A and a cable connecting the source printed circuit boards.

FIG. 2A is a plan view illustrating an example of a rear side of a display device according to embodiments of the present disclosure, and FIG. 2B is an enlarged view illustrating a connection relationship between source printed circuit boards illustrated in FIG. 2A and a cable connecting the source printed circuit boards.

Referring to FIG. 2A, a display device 100 may include a display panel 110, a first source printed circuit board 130a disposed on one side (e.g., the rear side) of the display panel 110, a second source printed circuit board 130b disposed on the one side of the display panel 110, a first integrated circuit 132a disposed on a first base film 131a connected to the display panel 110 and the first source printed circuit board 130a, a second integrated circuit 132b disposed on a second base film 131b connected to the display panel 110 and the second source printed circuit board 130b, and a bridge printed circuit board 140a configured to supply a signal and voltage to the first source printed circuit board 130a.

In the display device 100, the bridge printed circuit board 140a may be connected to the first source printed circuit board 130a by a first cable 141a and a second cable 141b. The first source printed circuit board 130a and the second source printed circuit board 130b may be connected to each other by a first source cable 180a. However, the present disclosure is not limited thereto. Each of the first cable 141a, the second cable 141b, and the first source cable 180a may be a Flexible Flat Cable (FFC). However, the present disclosure is not limited thereto. The bridge printed circuit board 140a may supply a high-speed signal to the first source printed circuit board 130a and the second source printed circuit board 130b. In addition, the bridge printed circuit board 140a may supply a differential signal to the first source printed circuit board 130a and the second source printed circuit board 130b. However, the present disclosure is not limited thereto.

In addition, the display device 100 may further include a third source printed circuit board 130c disposed on the one side of the display panel 110 and a fourth source printed circuit board 130d disposed on the one side of the display panel 110. In addition, the display device 100 may include a third integrated circuit 132c disposed on a third base film 131c connected to the display panel 110 and the third source printed circuit board 130c, and a fourth integrated circuit 132d disposed on a fourth base film 131d connected to the display panel 110 and the fourth source printed circuit board 130d.

Further, the bridge printed circuit board 140a and the third source printed circuit board 130c may be connected to each other by the third cable 141c and the fourth cable 141d. The third source printed circuit board 130c and the fourth source printed circuit board 130d may be connected to each other by a second source cable 180b. However, the present disclosure is not limited thereto. The bridge printed circuit board 140a may supply a high-speed signal to the third source printed circuit board 130c and the fourth source printed circuit board 130d. In addition, the bridge printed circuit board 140a may supply a differential signal to the third source printed circuit board 130c and the fourth source printed circuit board 130d. However, the present disclosure is not limited thereto.

Each of the third cable 141c, the fourth cable 141d, and the second source cable 180b may be an FFC. However, the present disclosure is not limited thereto.

The first source cable 180a may be disposed between the first source printed circuit board 130a and the second source printed circuit board 130b, and the second source cable 180b may be disposed between the third source printed circuit board 130c and the fourth source printed circuit board 130d. Therefore, the lengths of the first source cable 180a and the second source cable 180b can be minimized. When the lengths of the first source cable 180a and the second source cable 180b are minimized, the degradation of transmission efficiency of signals, which is caused by the lengths of the first source cable 180a and the second source cable 180b, can be minimized.

The first source cable 180a, which is disposed between the first source printed circuit board 130a and the second source printed circuit board 130b, has a width W1, which is smaller than the width W2 of the first source printed circuit board 130a and the second source printed circuit board 130b, as illustrated in FIG. 2B. Thus, the area of the first source cable 180a can be reduced. Here, the width W1 of the first source cable 180a is illustrated as being smaller than the width of the first source printed circuit board 130a and the second source printed circuit board 130b. However, the width of the second source cable 180b disposed between the third source printed circuit board 130c and the fourth source printed circuit board 130d may also be smaller than the width of the third source printed circuit board 130c and the fourth source printed circuit board 130d, and in some embodiments the second source cable 180b may have a same or substantially same width as the width W1 of the first source cable 180a shown in FIG. 2B.

In addition, the bridge printed circuit board 140a may be connected to a control circuit board 140b. The bridge printed circuit board 140a may cause the signals, which are transmitted from the control circuit board 140b, to be transmitted to the first to fourth source printed circuit boards 130a to 130d. The bridge printed circuit board 140a may be connected to the control circuit board 140b by a fifth cable 151. The fifth cable 151 may be an FFC. The bridge printed circuit board 140a may convert signals received from the control circuit board 140b into high-speed signals, and may transmit the converted signals. In addition, the bridge printed circuit board 140a may convert the signals received from the control circuit board 140b into differential signals, and may transmit the differential signals. However, the present disclosure is not limited thereto.

The first to fourth integrated circuits 132a to 132d may be the plurality of integrated circuits included in the gate driver 120 or the data driver 130 illustrated in FIG. 1. In addition, the controller 140 illustrated in FIG. 1 may be disposed on the bridge printed circuit board 140a and/or the control circuit board 140b. However, the present disclosure is not limited thereto.

Figure 3:
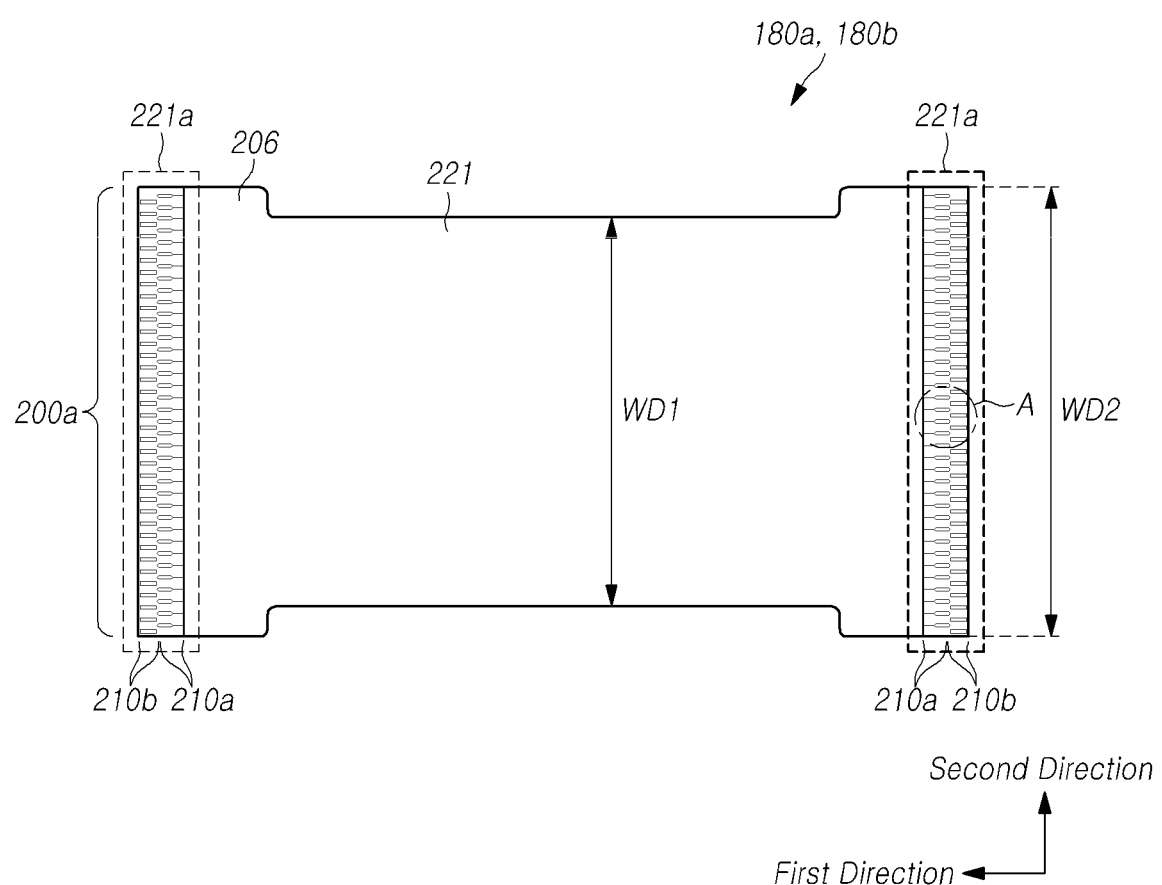
FIG. 3 is a plan view illustrating the upper face of a source cable according to embodiments of the present disclosure.
Figure 4:
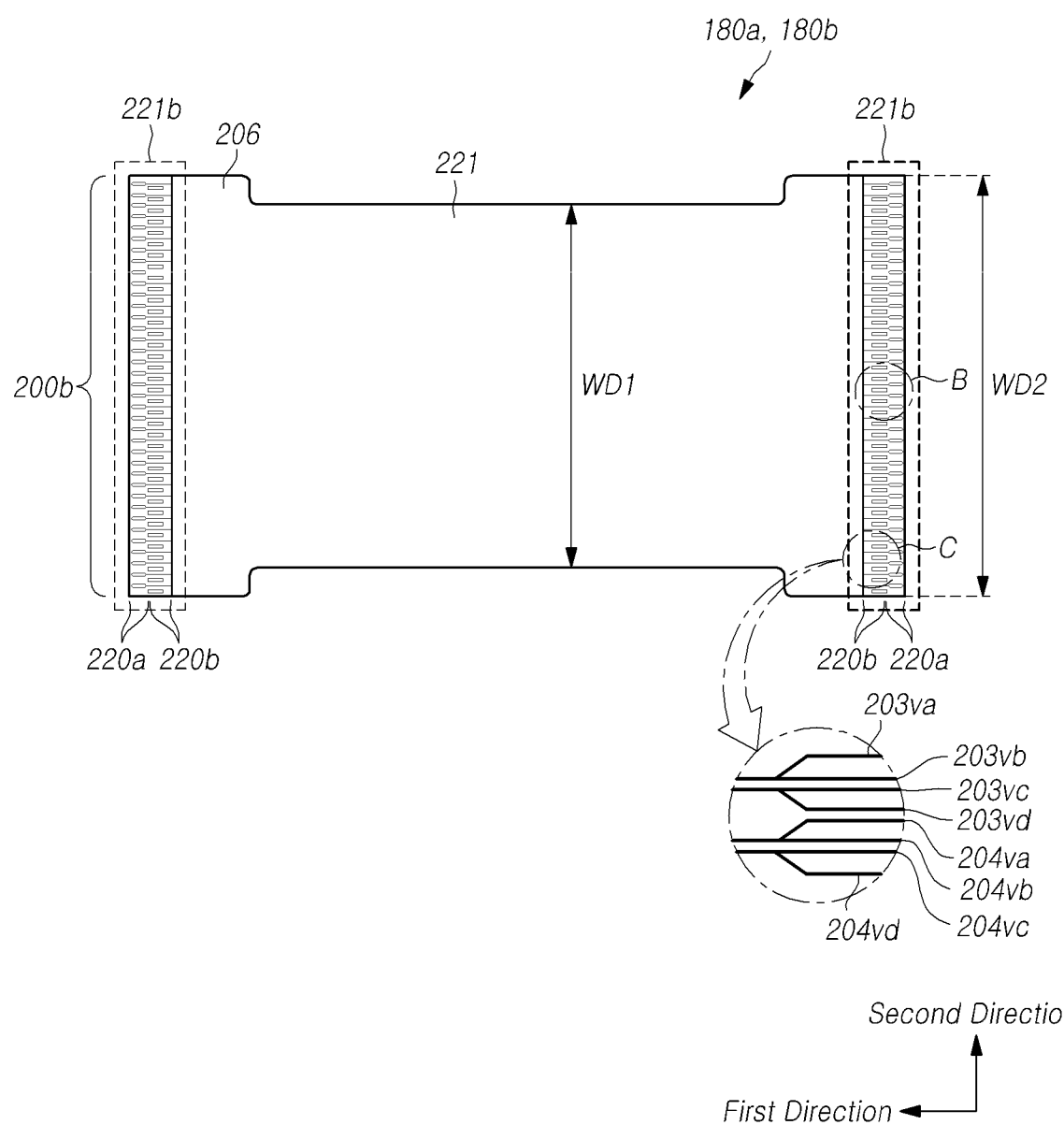
FIG. 4 is a plan view illustrating the lower face of the source cable according to embodiments of the present disclosure.

FIG. 3 is a plan view illustrating a first face (e.g., the upper face) of a source cable according to embodiments of the present disclosure, and FIG. 4 is a plan view illustrating a second face (e.g., the lower face) of the source cable according to embodiments of the present disclosure.

Referring to FIGS. 3 and 4, a source cable 180a or 180b may extend in a first direction, and an upper pin region 221a and a lower pin region 221b may be disposed on the opposite faces of each end portion of the source cable 180a or 180b, respectively. The source cable 180a or 180b may have an upper wiring (which may be referred to herein as a first wiring layer) and upper pins 200a connected to the upper wiring on the first face of the film 221, and a lower wiring (which may be referred to herein as a second wiring layer) and lower pins 200b connected to the lower wiring on the second face of the film 221. In addition, the source cable 180a or 180b can be covered with coverlays 206 on the upper and lower faces thereof. The coverlays 206 do not cover an upper pin region 221a and a lower pin region 221b, so that the upper pins 200a and the lower pins 200b may be exposed. The film 221 may be an insulating film. The upper face of the source cable 180a or 180b covered with coverlays 206 may display an information of the source cable 180a or 180b. In addition, a plurality of upper wirings and the upper pins 200a disposed on the film 221 may be arranged respectively parallel to each other in a second direction. In an example, the first direction is transverse with respect to the second direction, and the second direction may be perpendicular with respect to the first direction. For example, the source cable 180a or 180b may have a length along the first direction and a width along the second direction as shown in FIGS. 3 and 4. Further, a plurality of lower wirings and the lower pins 200b disposed on the film 221 may be arranged respectively parallel to each other in the second direction.

Respective cable pins 200a and 200b disposed in the upper pin region 221a and the lower pin region 221b on one side or end of the source cable 180a or 180b (e.g., on the left or right side as shown in FIGS. 3 and 4) are connected to respective cable pins 200a and 200b disposed in the upper pin region 221a and the lower pin region 221b on the other side via one wiring. That is, at least some of the cable pins 200a disposed in the upper pin region 221a on the left side of the source cable 180a or 180b as shown in FIG. 3 are connected by respective wirings to corresponding cable pins 200a that are disposed in the upper pin region 221a on the right side of the source cable 180a or 180b. Similarly, at least some of the cable pins 200b disposed in the lower pin region 221b on the left side of the source cable 180a or 180b as shown in FIG. 4 are connected by respective wirings to corresponding cable pins 200b that are disposed in the lower pin region 221b on the right side of the source cable 180a or 180b. The cable pins 200a and 200b may be formed wider than the wirings so as to facilitate electrical contact, e.g., by providing a wider contact area at the cable pins 200a and 200b. Accordingly, in the source cable 180a or 180b, the widths WD2, in the second direction, of a region corresponding to the upper pin region 221a or the lower pin region 221b may be wider than the width WD1, in the second direction, of a region where the upper pin region 221a or the lower pin region 221b is not arranged. However, the present disclosure is not limited thereto. WD1 and/or WD2 may be the width W1 of the source cables 180a and 180b illustrated in FIG. 2B. That is, when the width W1 of the source cables 180a or 180b is narrowed, it may mean that only WD1 is narrowed or only WD2 is narrowed. In addition, both WD1 and WD2 may be narrowed in some embodiments.

The upper pin region 221a and the lower pin region 221b may overlap each other. The term "overlap" may mean that when the upper pin region 221a and the lower pin region 221b, which exist in or on different layers with respect to the film 221, are projected to the same plane, the upper pin region 221a and the lower pin region 221b are arranged at a position at which they overlap each other. However, the term, "overlap" does not necessarily mean that the upper pin region 221a and the lower pin region 221b completely overlap each other when the upper pin region 221a and the lower pin region 221b are projected to the same plane.

The upper pin region 221a may include a first pin region 210a and a first dummy pin region 210b, which may be adjacent to one another, for example, along the first direction. The lower pin region 221b may include a second pin region 220a and a second dummy pin region 220b, which may be adjacent to one another, for example, along the first direction. Each of the first pin region 210a and the second pin region 220a is a region where cable pins, which are connected to wirings (e.g., the upper or lower wirings) disposed in the source cable 180a or 180b so as to be capable of transmitting signals, are disposed, and each of the first dummy pin region 210b and the second dummy pin region 220b may be a region where dummy pins, which are not connected to the wirings disposed in the source cable 180a or 180b so as not to be capable of transmitting signals, are disposed. That is, the cable pins are connected to the wirings of the source cable 180a or 180b, while the dummy pins are electrically separated from the wirings, as will be described in further detail later herein. The plurality of cable pins are arranged parallel to each other in the second direction in each of the first pin region 210a and the second pin region 220a, and the plurality of dummy pins may be arranged parallel to each other in the second direction in each of the first dummy pin region 210b and the second dummy pin region 220b. In addition, the first pin region 210a and the second dummy pin region 220b, which are placed on different layers of the film 221, may overlap each other, and the first dummy pin region 210b and the second pin region 220a, which are placed on different layers of the film 221, may overlap each other.

Here, the source cable 180a or 180b is illustrated as a first source cable 180a that connects the first source printed circuit board 130a and the second source printed circuit board 130b, or a second source cable 180b that connects the third source printed circuit board 130c and the fourth source printed circuit board 130d. However, the source cable 180a or 180b is not limited thereto, and the features described with respect to the source cable 180a or 180b may be applied to any or all of the cables 141a, 141b, 141c, 141d, and 151 illustrated in FIG. 2A.

In addition, a plurality of power lines 203va, 203vb, 203vc, 203vd, 204va, 204vb, 204vc, 204vd may be arranged in the source cable 180a or 180b. In a region C in a lower pin region in the source cable 180a or 180b and the plurality of power lines 203va, 203vb, 203vc, 203vd, 204va, 204vb, 204vc, 204vd may be exposed. FIG. 4 schematically illustrates the region C in an enlarged view portion. Further details of the region C will be described with respect to FIG. 6C.

Figure 5A:
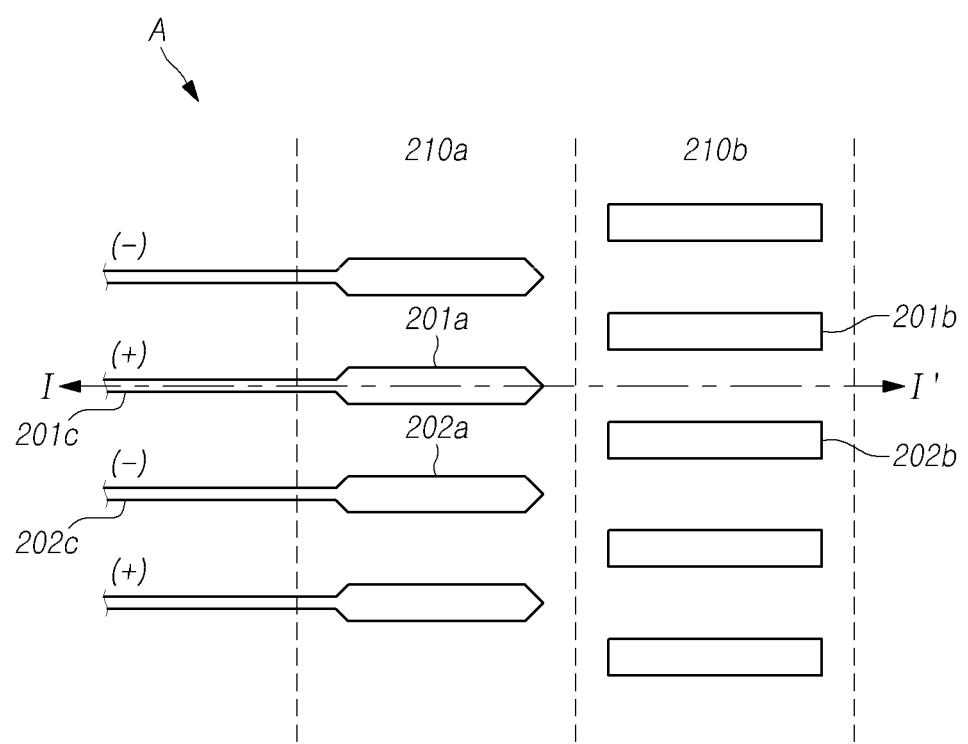
FIG. 5A is an enlarged view illustrating an arrangement relationship of pins arranged in a region A in an upper pin region illustrated in FIG. 3.
Figure 6A:
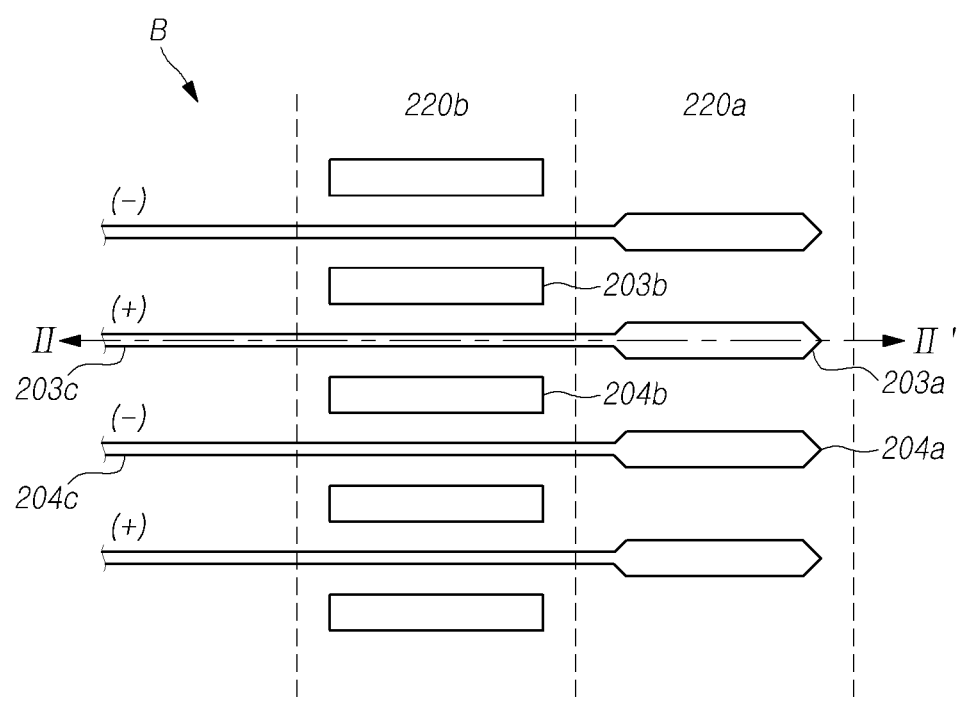
FIG. 6A is an enlarged view illustrating an arrangement relationship of pins arranged in a region B in a lower pin region illustrated in FIG. 4.

FIG. 5A is an enlarged view illustrating an arrangement relationship of cable pins arranged in a region A in an upper pin region illustrated in FIG. 3, and FIG. 6A is an enlarged view illustrating an arrangement relationship of cable pins arranged in a region B in a lower pin region illustrated in FIG. 4.

Referring to FIG. 5A, the region A is disposed on the upper face of the source cable 180a or 180b, and may include portions of the first pin region 210a and the first dummy pin region 210b. In the first pin region 210a, an upper cable pin including a first cable pin 201a and a second cable pin 202a, which are parallel to each other in the second direction, may be disposed. The first cable signal line 201c and the second cable signal line 202c extending in the first direction may be connected to the first cable pin 201a and the second cable pin 202a, respectively. The first cable signal line 201c and the second cable signal line 202c may be included in the upper wiring. A positive (+) signal may be transmitted to the first cable signal line 201c and a negative (−) signal may be transmitted to the second cable signal line 202c. However, the present disclosure is not limited thereto, and a negative (−) signal may be transmitted to the first cable signal line 201c and a positive (+) signal may be transmitted to the second cable signal line 202c. That is, a positive (+) signal may be transmitted to one of two adjacent cable signal lines, and a negative (−) signal may be transmitted to the other of the two adjacent cable signal lines. An upper dummy pin including a first dummy pin 201b and a second dummy pin 202b which are parallel to each other in the second direction may be disposed in the first dummy pin region 210b. No cable signal line is connected to the first dummy pin 201b or to the second dummy pin 202b. The upper cable pin and the upper dummy pin may be collectively referred to as an upper pin 200a.

Referring to FIG. 6A, the region B is disposed on the lower face of the source cable 180a or 180b, and may include portions of the second dummy pin region 220b and the second pin region 220a. The second dummy pin region 220b may overlap the first pin region 210a, and the second pin region 220a may overlap the first dummy pin region 210b.

A lower dummy pin including a third dummy pin 203b and a fourth dummy pin 204b parallel to each other in the second direction may be disposed in the second dummy pin region 220b. No cable signal line is connected to the third dummy pin 203b or to the fourth dummy pin 204b. In the second pin region 220a, lower cable pins including a third cable pin 203a or a fourth cable pin 204a are disposed parallel to each other in the second direction. The lower dummy pin and the lower cable pin may be collectively referred to as a lower pin 200b. The third cable signal line 203c and the fourth cable signal line 204c extending in the first direction may be connected to the third cable pin 203a and the fourth cable pin 204a, respectively. The third cable signal line 203c and the fourth cable signal line 204c may be included in the lower wiring. The third dummy pin 203b may be disposed between the third cable signal line 203c and the fourth cable signal line 204c. In addition, a positive (+) signal may be transmitted to the third cable signal line 203c and a negative (−) signal may be transmitted to the fourth cable signal line 204c. However, the present disclosure is not limited thereto, and a negative (−) signal may be transmitted to the third cable signal line 203c and a positive (+) signal may be transmitted to the fourth cable signal line 204c. That is, a positive (+) signal may be transmitted to one of two adjacent cable signal lines, and a negative (−) signal may be transmitted to the other of the two adjacent cable signal lines.

The first cable signal line 201c and the third cable signal line 203c may transmit signals having a first polarity (e.g., a positive (+) signal), and the second cable signal line 202c and the fourth cable signal line 204c may transmit signals having a second polarity (e.g., negative (−) signals). Thus, when the first cable signal line 201c and the second cable signal line 202c or the third cable signal line 203c and the fourth cable signal line 204c are short circuited, signals may flow from the first cable signal line 201c to the second cable signal line 202c or from the third cable signal line 203c to the fourth cable signal line 204c, which may cause the circuit to be damaged. Accordingly, the adjacent first and second cable signal lines 201c, 202c, and the adjacent third and fourth cable signal lines 203c, 204c should be disposed at a predetermined interval. That is, the adjacent cable signal lines should be spaced apart from one another by a sufficient distance to prevent or reduce the occurrence of short circuits between the adjacent cable signal lines. In addition, the first cable signal line 201c and the second cable signal line 202c or the third cable signal line 203c and the fourth cable signal line 204c, which are disposed in the upper pin region 221a or the lower pin region 221b of the source cables 180a and 180b, and which are arranged to have therebetween a predetermined interval reflecting a predetermined margin, may not be short circuited due to the predetermined interval or spacing between the adjacent cable signal lines. In addition, the first cable signal line 201c and the second cable signal line 202c or the third cable signal line 203c and the fourth cable signal line 204c may be disposed to pass between dummy pins arranged in the first dummy pin region 210b or the second dummy pin region 220b. Therefore, the first cable signal line 201c and the second cable signal line 202c or the third cable signal line 203c and the fourth cable signal line 204c, which transmit signals having different polarities, may be arranged at an interval wider than a predetermined margin.

Figure 5B:
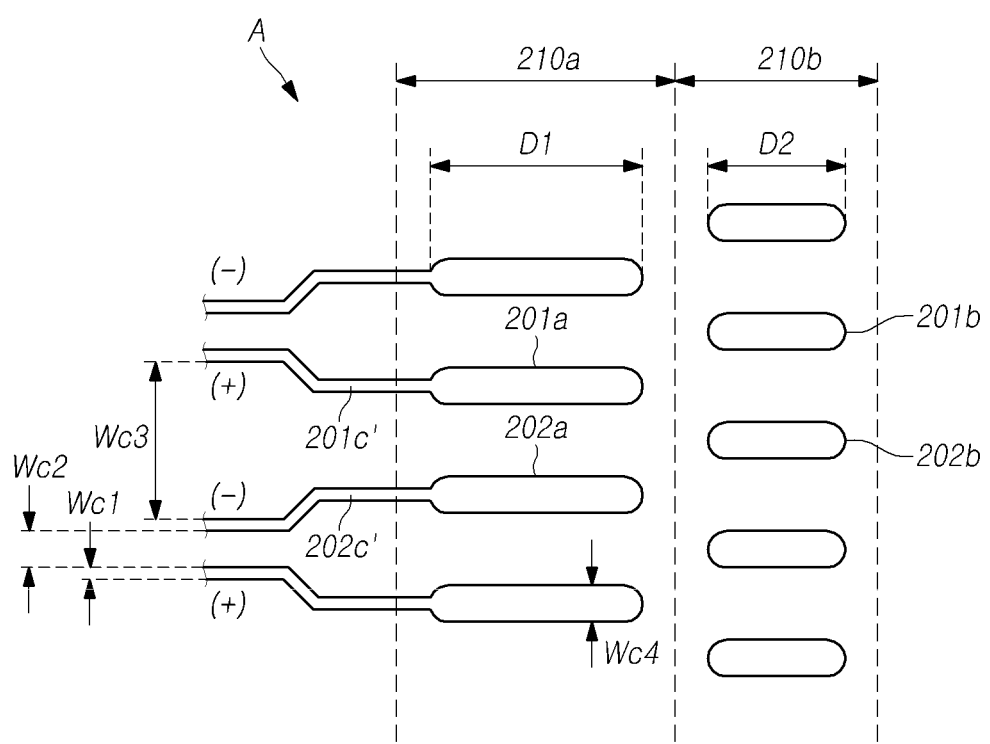
FIG. 5B is an enlarged view illustrating an arrangement relationship of pins arranged in the region A and a reduced margin between adjacent cable signal lines, in accordance with one or more embodiments.
Figure 6B:
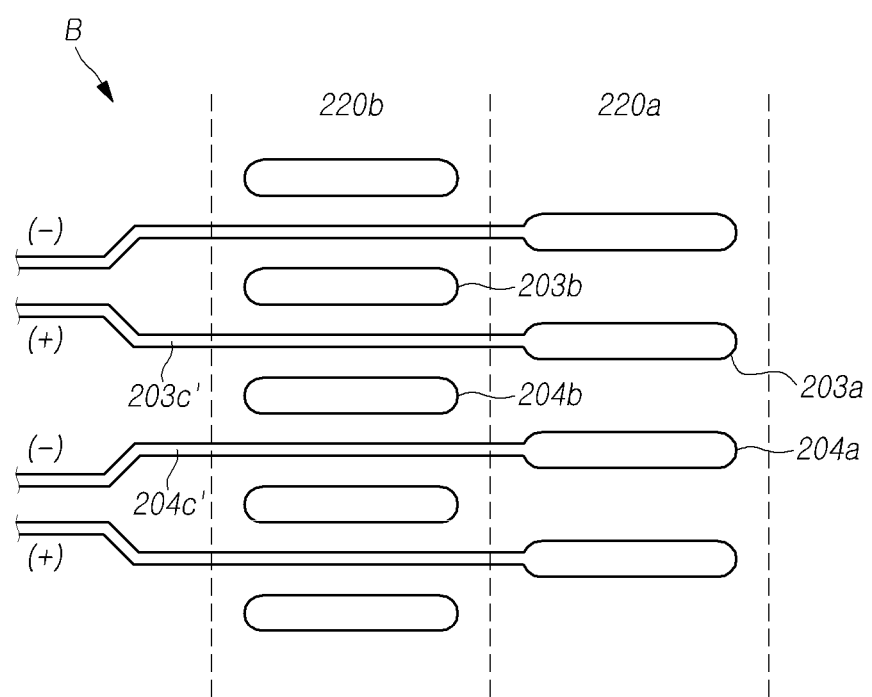
FIG. 6B is an enlarged view illustrating an arrangement relationship of pins arranged in the region B and a reduced margin between adjacent cable signal lines, in accordance with one or more embodiments.

FIGS. 5B and 6B are substantially the same as FIGS. 5A and 6A, respectively, except that in FIGS. 5B and 6B pairs of adjacent cable signal lines have a smaller margin or distance between them in a cable signal line routing area than the margin between the respective cable pins from which they extend. The cable signal line routing area may be one or more areas on the upper and lower faces of the source cable 180a or 180b which is positioned between the upper pin regions 221a on opposite sides of the upper face and between the lower pin regions 221b on opposite sides of the lower face. For example, the margin between the pairs of adjacent cable signal lines is less than the margin between the respective pins from which the pairs of adjacent cable signal lines extend in the first pin region 210a on the upper face of the source cable 180a or 180b (see FIG. 5B) or in the second pin region 220a on the lower face of the source cable 180a or 180b (see FIG. 6B).

As shown on FIG. 5B, a length D1 of the first cable pin 201a which is arranged in the first pin area 210a is longer than a length D2 of the first dummy pin 201b which is arranged in the first dummy pin area 210b. And, pairs of adjacent cable signal lines which transmits a positive (+) signal and a negative (−) signal, respectively, may be designed to minimize or otherwise reduce the spacing between the pairs of adjacent cable signal lines for impedance matching and elimination of common noise. For example, a distance Wc2 between a cable signal line which transmits a positive (+) signal and a cable signal line which transmits a negative (−) signal may be less than the distance between the cable pins from which the pair of adjacent cable signal lines extend. In some embodiments, the distance Wc2 between a pair of adjacent cable signals which respectively transmit a positive (+) and a negative (−) signal may be the same or less than the width Wc1 of the cable signal line. Although FIG. 5B illustrates the width Wc1 of the cable signal line being greater than the distance Wc2 between a pair of adjacent cable signal lines, it should be readily appreciated that in various embodiments, the width Wc1 and/or the distance Wc2 may be variously designed, and in some embodiments, the distance Wc2 may be equal to or less than the width Wc1.

And, adjacent cable signal lines which are not part of a same pair of cable signal lines may be spaced apart from one another by a distance Wc3. For example, cable signal lines 201c' and 202c' may extend outward from the first cable pin 201a along the first direction (e.g., the horizontal direction shown in FIG. 5B) and then may extended away from each other so that the cable signal lines 201c' and 202c' are spaced apart from one another by the distance Wc3. In some embodiments, the distance Wc3 may be at least three times the width Wc1 of the first cable pin 201a. The increased spacing or distance W3 between cable signal lines which are not part of a same pair of cable signal lines facilitates a reduction or minimization of signal interference between such adjacent cable signal lines.

In addition, a width Wc4 of the cable pins (e.g., the first cable pin 201a) may be greater than the width Wc1 of the cable signal lines (e.g., the first cable signal line 201c'). The cable pin, such as the first cable pin 201a, provides contact areas for electrically contacting to other electrodes, and thus, the cable pins may have a larger width than the corresponding cable signal lines, which facilitates improved electrical connection to other electrodes.

As shown in FIG. 5B, each of the first cable signal line 201c' (which may transmit a positive (+) signal) and the adjacent cable signal line above the first cable signal line 201c' (which may transmit a negative (−) signal) extend outward from respective pins along the first direction (e.g., the horizontal direction shown in FIG. 5B). Outside of the first pin region 210a, segments of the adjacent pair of cable signal lines extend toward one another to a margin that is less than the margin between the pair of cable signal lines in the first pin region 210a. The adjacent pair of cable signal lines then extend along the first direction through the cable signal line routing area, and may have the reduced margin or spacing between them along the cable signal line routing area. For example, each of the adjacent pair of cable signal lines have segments that extend toward one another at respective angles with respect to the first direction, as shown in FIG. 5B.

Additionally, as shown in FIG. 5B, the cable pins and/or the dummy pins may have a rounded shape. For example, end portions of the cable pins and/or the dummy pins may be at least partially rounded.

FIG. 6B similarly shows pairs of adjacent cable signal lines have a smaller margin or distance between them in a cable signal line routing area than the margin between the respective cable pins from which they extend. For example, as shown in FIG. 6B, each of the third cable signal line 203c' (which may transmit a positive (+) signal) and the adjacent cable signal line above the third cable signal line 203c' (which may transmit a negative (−) signal) extend outward from respective pins along the first direction (e.g., the horizontal direction shown in FIG. 6B). Outside of the second pin region 220a and/or the second dummy pin region 220b, segments of the adjacent pair of cable signal lines extend toward one another to a margin that is less than the margin between the pair of cable signal lines in the second pin region 220a. The adjacent pair of cable signal lines then extend along the first direction through the cable signal line routing area, and may have the reduced margin or spacing between them along the cable signal line routing area.

The adjacent pairs of cable signal lines may extend toward one another at any angle with respect to the first direction. For example, in some embodiments, the adjacent pairs of cable signal lines may extend toward one another at angles between about 30° and 60° with respect to the first direction. However, this range is provided only as an example, and embodiments of the present disclosure are not limited thereto. Moreover, the adjacent pairs of cable signal lines may be curved or have any other geometry such that the adjacent pairs of cable signal lines extend toward one another to a reduced margin or distance between them.

By reducing the margin or distance between adjacent pairs of cable signal lines, as shown in FIGS. 5B and 6B, a difference in noise signals which may be carried by the adjacent pairs of cable signal lines may be reduced. For example, in embodiments in which adjacent cable signal lines carry differential signals (e.g., one transmitting a positive (+) signal and the other transmitting a negative (−) signal), each of the adjacent cable signal lines will be subjected to the same or similar noise signals since the distance between adjacent cable signal lines is reduced.

Figure 6C:
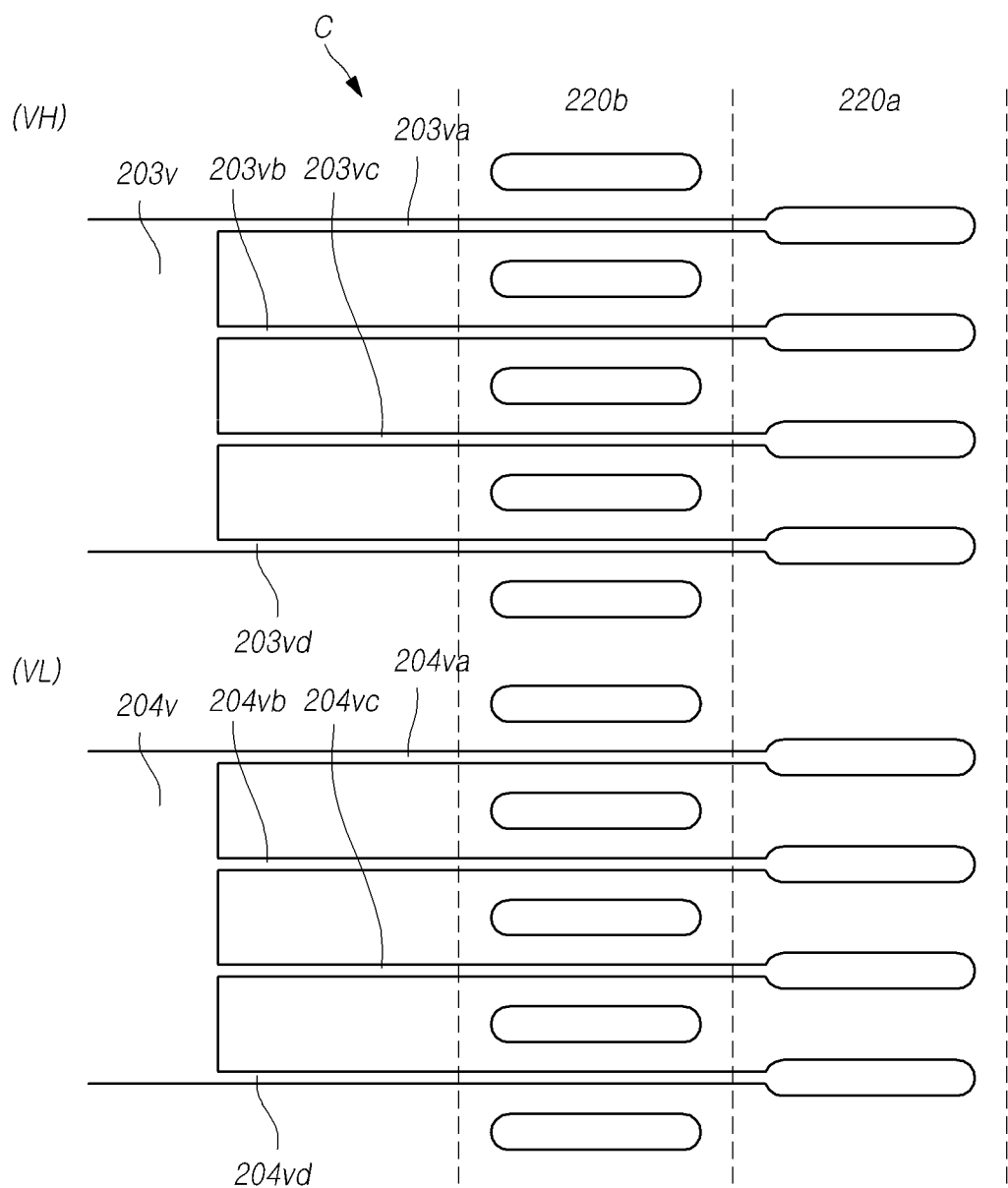
FIG. 6C is an enlarged view illustrating an arrangement relationship of pins arranged in the region C and a reduced margin between adjacent cable signal lines, in accordance with one or more embodiments.

FIG. 6C is an enlarged view illustrating an arrangement relationship of pins arranged in the region C and a reduced margin between adjacent cable signal lines, in accordance with one or more embodiments.

Referring to FIG. 6C, a power source line 203v which transmits a high potential voltage VH and a power source line 204v which transmits a low potential voltage VL may be arranged in routing area of the source cable 180a or 180b. The power source line 203v is divided into four power line 203va, 203vb, 203vc, and 203vd and the power source line 204v is divided into four power line 204va, 204vb, 204vc, and 204vd in a region C of the lower pin region. Each of the power lines 203va, 203vb, 203vc, and 203vd that are connected to the power source line 203v may further be connected to respective power supply pins, for example, in the second pin region 220a. Similarly, each of the power lines 204va, 204vb, 204vc, and 204vd that are connected to the power source line 204v may further be connected to respective power supply pins, for example, in the second pin region 220a.

Figure 7:
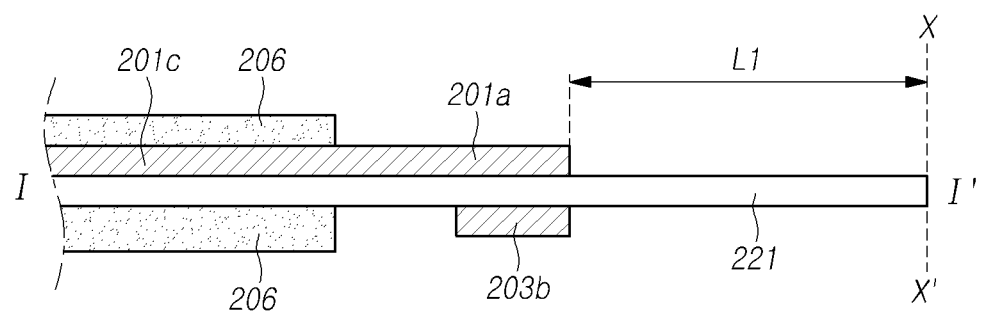
FIG. 7 is a cross-sectional view illustrating a cross section of the source cable, which is taken along line I-I' in FIG. 5A.
Figure 8:
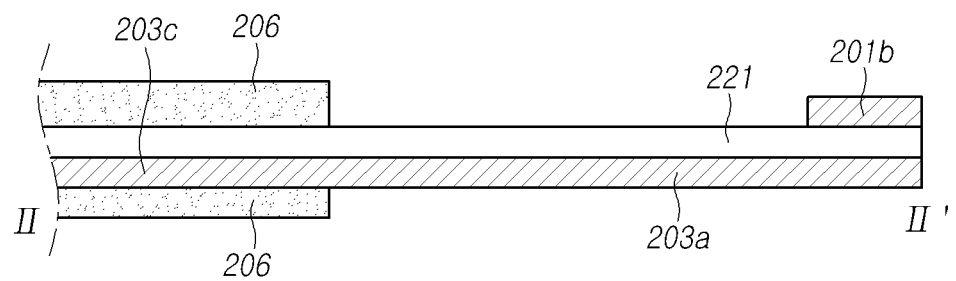
FIG. 8 is a cross-sectional view illustrating a cross section of the source cable, which is taken along line II-II' in FIG. 6A.

FIG. 7 is a cross-sectional view illustrating a cross section of the cable, which is taken along line I-I' in FIG. 5A, and FIG. 8 is a cross-sectional view illustrating a cross section of the cable, which is taken along line II-II' in FIG. 6A.

Referring to FIG. 7, the source cable 180a or 180b may have a first cable signal line 201c extending in the first direction and disposed on a film 221. The film 221 may be an insulating film. In addition, the upper portion of the first cable signal line 201c may be covered with a coverlay 206. A first cable pin 201a may be formed in a portion of the first cable signal line 201c, which is not covered with the coverlay 206 thereon. The first cable pin 201a may be exposed and disposed at a predetermined distance from the coverlay 206 on the film 221. In addition, a third dummy pin 203b may be disposed on the lower portion or lower face of the film 221. The lower portion of the film 221 may be covered with a coverlay 206. The coverlay 206 may be disposed at a predetermined distance from the third dummy pin 203b on the lower portion of the film 221, and may cover the lower portion of the film 221. The coverlays 206 are capable of protecting signal lines disposed on the upper portion and lower portion of the film 221.

Referring to FIG. 8, the source cable 180a or 180b may have a first dummy pin 201b disposed on an upper portion or upper face of the film 221. The upper portion of the film 221 may be covered with a coverlay 206. The coverlay 206 may cover the upper portion of the film 221 at a predetermined distance from a first dummy pin 201b.

In addition, a third cable signal line 203c may be disposed on the lower portion of the film 221. In addition, the lower portion of the third cable signal line 203c may be covered with a coverlay 206. A third cable pin 203a may be formed in a portion of the third cable signal line 203c that is not covered with the coverlay 206 thereunder. The third cable pin 203a may be disposed at a predetermined distance from the coverlay 206.

At this time, the first cable pin 201a and the third dummy pin 203b may be arranged to overlap each other as shown in FIG. 7, and the third cable pin 203a and the first dummy pin 201b may be arranged to overlap each other as shown in FIG. 8. In addition, the first cable pin 201a and the third dummy pin 203b may be arranged to have a first interval L1 from the end of the film 221 and the third cable pin 203a and the first dummy pin 201b may be disposed at the end of the film 221. By the first interval L1, the first cable pin 201a and the third dummy pin 203b may be arranged in the first pin region 210a and the second dummy pin region 220b, which overlap each other, and the third cable pin 203a and the first dummy pin 201b may be arranged in the second pin region 220a and the first dummy pin region 210b.

Figure 9:
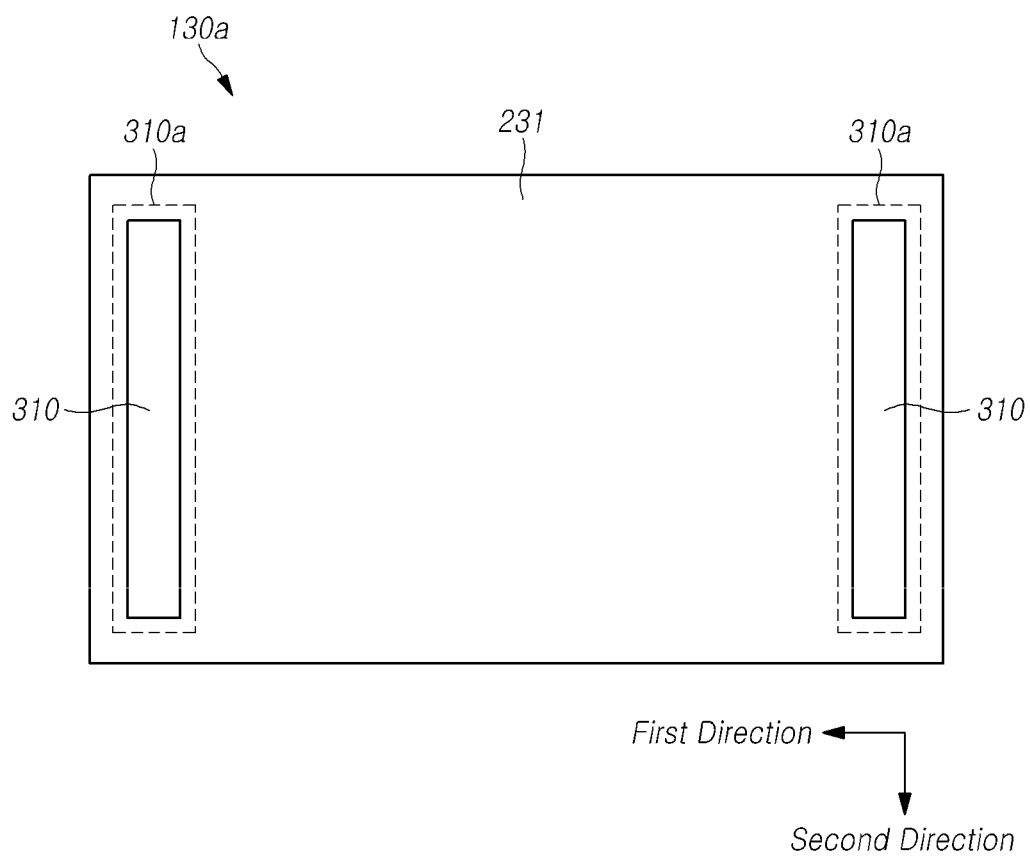
FIG. 9 is a plan view illustrating a source printed circuit board according to embodiments of the present disclosure.

FIG. 9 is a plan view illustrating a source printed circuit board according to embodiments of the present disclosure.

Referring to FIG. 9, the first source printed circuit board 130a may include a body 231 (which may be referred to herein as a body portion 231) and a connector 310 disposed on the upper face of the body portion 231. Here, the first source printed circuit board 130a is illustrated. However, the source printed circuit board is not limited thereto, and the second to fourth source printed circuit boards 130b to 130d (FIG. 2A) may have the same configuration. However, the source printed circuit board is not limited thereto. In addition, the features described herein with respect to the source printed circuit board may also be employed in the bridge printed circuit board 140a and the control printed circuit board 140b illustrated in FIG. 2A.

A plurality of wirings may be arranged in the body portion 231 in a multilayer structure. The plurality of wirings may transmit signals and/or voltages. The base films 131a, 131b, 131c, and 131d, on which the integrated circuits 132a, 132b, 132c, and 132d are arranged, may be connected to the upper face or upper portion of the body portion 231. However, the present disclosure is not limited thereto.

The connector 310 may be disposed on or adjacent to an edge of the body portion 231. Although the number of connectors 310 arranged on the edges is illustrated as two, the present disclosure is not limited thereto. The first source printed circuit board 130a may include board pin regions 310a (which may be referred to herein as third pin regions 310a) which may be disposed under respective connectors 310 and disposed on the body portion 231. A plurality of board pins may be arranged in the second direction in the third pin regions 310a, and board signal lines connected to the wirings in the body portion 231 may be connected to the board pins, respectively. The board signal lines and the wiring in the body portion 231 may be a single configuration rather than separate configurations. The third pin regions 310a may be covered by the connectors 310 disposed thereon. However, the present disclosure is not limited thereto.

Figure 10:
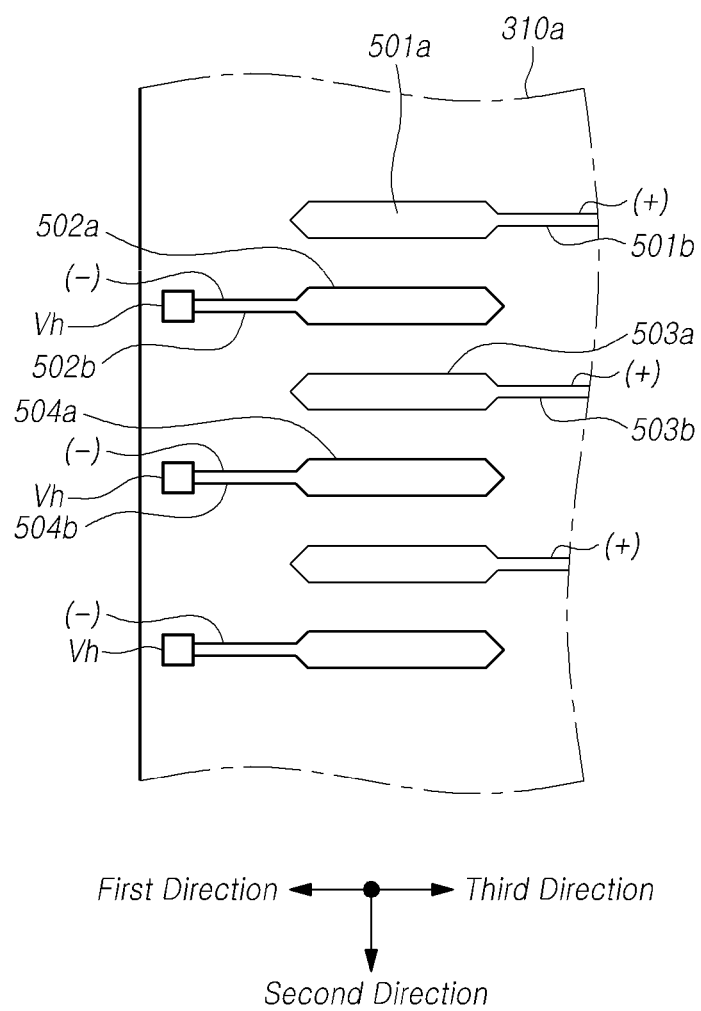
FIG. 10 is an enlarged plan view illustrating a portion of a third pin region disposed on the source printed circuit board illustrated in FIG. 9.

FIG. 10 is an enlarged plan view illustrating a portion of a third pin region disposed on the source printed circuit board illustrated in FIG. 9.

Referring to FIG. 10, the first to fourth board pins 501a to 504a may be arranged in the second direction in the third pin region 310a of the first source printed circuit board 130a (also referred as the first source printed circuit board 130a). In addition, the first board pin 501a and the third board pin 503a may be respectively connected to the first board signal line 501b and the third board signal line 503b extending in a third direction on the upper face of the body portion 231, wherein the third direction is opposite to the first direction. In addition, the second board pin 502a and the fourth board pin 504a may be respectively connected to the second board signal line 502b and the fourth board signal line 504b extending in the first direction on the upper face of the body portion 231. The second board signal line 502b and the fourth board signal line 504b may be connected to the wirings in the body portion 231 through conductive vias or via holes Vh formed in or near an edge of the body portion 231.

The first to fourth board pins 501a to 504a, which transmit signals on the first source printed circuit board 130a, may also transmit a positive (+) signal or a negative (−) signal. The first board pin 501a and the third board pin 503a, among the first to fourth board pins 501a to 504a, may transmit a positive (+) signal, and the second board pin 502a and the fourth board pin 504a may transmit a negative (−) signal. However, without being limited thereto, the first board pin 501a and the third board pin 503a may transmit a negative (−) signal and the second board pin 502a and the fourth board pin 504a may transmit a positive (+) signal. Board pins are not limited to transmitting positive (+) and negative (−) signals in the above-described manner.

Even in the first source printed circuit board 130a, two adjacent pins, for example, the first board pin 501a and the second board pin 502a, may transmit signals having different polarities. Accordingly, the signal lines connected to the adjacent pins are arranged at a predetermined interval based on a predetermined margin, thereby preventing the signal lines from being short circuited. The first source printed circuit board 130a may become larger in size than the cable, and thus a larger margin than the margin set in the cable may be set for the first source printed circuit board 130a. Particularly, in the case of the first source printed circuit board 130a employed in a large-sized display device, since the size difference between the source cables 180a and 180b and the first source printed circuit board 130a is very large, the margin set in the source cables 180a and 180b and the margin set in the first source printed circuit board 130a are set to have a large difference therebetween. Therefore, when the source cables 180a and 180b are manufactured by applying thereto the margin set to the first source printed circuit board 130a, the width of the source cables 180a and 180b becomes very wide.

Therefore, it may become impossible or particularly difficult to dispose the source cable 180a or 180b between the first source printed circuit board 130a and the second source printed circuit board 130b or between the third source printed circuit board 130c and the fourth source printed circuit board 130d illustrated in FIG. 2A, as the width of the source cables 180a and 180b and/or the sides of the source printed circuit boards (e.g., the sides of the first and second source printed circuit boards 130a, 130b that face each other and/or the sides of the third and fourth source printed circuit boards 130c, 130d that face each other as shown in FIG. 2A) may need to be larger due to the set margins. In such a case, the connectors 310 may be installed on the sides of the first source printed circuit board 130a and the second source printed circuit board 130b that face the display panel 110 (e.g., the top sides of the source printed circuit boards as shown in FIG. 2A), since the top sides of the source printed circuit boards are longer and therefore can accommodate the set margin or spacing between pins, and the source cable 180a or 180b may be connected thereto. However, when the connectors 310 are installed on the sides facing the display panel 110, the source cable 180a or 180b is bent and connected to the first source printed circuit board 130a and the second source printed circuit board 130b. That is, in such cases, the source cable 180a or 180b has bends between portions that extend upward (or vertically) from the top sides of the source printed circuit boards 130a, 130b and a portion that extends laterally (or horizontally). Therefore, the length of the source cables 180a and 180b is increased or otherwise may not be minimized, and the transmission rate of signals in the source cables 180a and 180b may deteriorate. In addition, there is a problem in that manufacturing costs increase due to an increase in the length and width of the source cables 180a and 180b.

However, when dummy pins are used as illustrated in FIGS. 3 to 8, the interval between the first cable signal line 201c and the second cable signal line 202c (FIG. 5A) of the source cables 180a and 180b or the interval between the third cable signal line 203c and the fourth cable signal line 204c (FIG. 6A) may correspond to the width of the first dummy pin 201b or the third dummy pin 203b. That is, the interval between the first cable signal line 201c and the second cable signal line 202c or the interval between the third cable signal line 203c and the fourth cable signal line 204c may be set to be larger than the margin set by the dummy pins 201b, 202b, 203b, and 204b. That is, when the dummy pins 201b, 202b, 203b, and 204b are disposed, even if the first to fourth cable signal lines 201c to 204c are disposed corresponding to the set margin, the interval between the first cable signal line 201c and the second cable signal line 202c or the interval between the third cable signal line 203c and the fourth cable signal line 204c may be larger than the set margin. The interval between the first cable signal line 201c and the second cable signal line 202c of the source cables 180a and 180b or the interval between the third cable signal line 203c and the fourth cable signal line 204c may be adjusted and may be different in various embodiments.

By disposing the second dummy pin region 220b, which overlaps the first pin region 210a, and the first dummy pin region 210b, which overlaps the second pin region 220a, on the upper face and the lower face of the source cables 180a and 180b, respectively, when the cable pins or wirings are disposed on the first source printed circuit board 130a, it is possible to prevent the width of the source cables 180a and 180b from being increased by the dummy pins 201b, 202b, 203b, and 204b.

Therefore, by providing the source cables 180a and 180b having a narrow width W1 and disposing and connecting the connectors 310 on the opposite sides of the first source printed circuit board 130a and the second source printed circuit board 130b (e.g., on sides of the source printed circuit boards 130a, 130b that face each other as shown in FIG. 2A), it is possible to minimize the length of the source cables 180a and 180b. Here, the structure of the source cables 180a and 180b may be applied to other cables illustrated in FIG. 2A.

In addition, since the first board signal line 501b and the third board signal line 503b connected to the first board pin 501a and the third board pin 503a extend in the third direction and the second board signal line 502b and the fourth board signal line extend in the first direction, adjacent signal lines having different polarities may extend in different directions. The margin between the board pins disposed on the first source printed circuit board 130a can be reduced. Thus, the width of the connectors 310 on the first source printed circuit board 130a can therefore be reduced. In addition, the width at which the first source printed circuit board 130a and the source cables 180a and 180b are connected can be further reduced.

Figure 11:
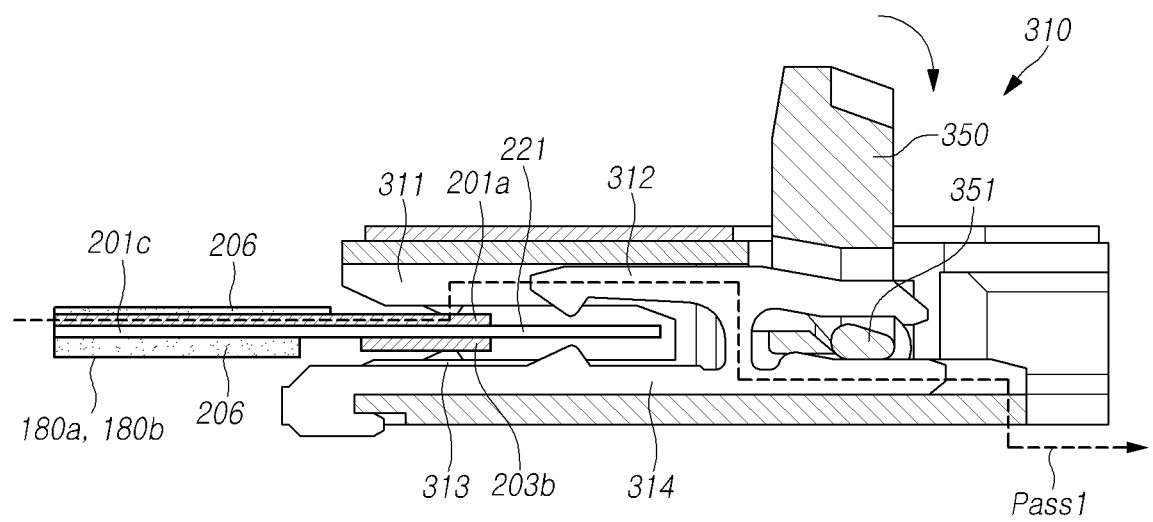
FIG. 11 is a side view illustrating one embodiment in which a source cable is inserted into a connector according to embodiments of the present disclosure.
Figure 12:
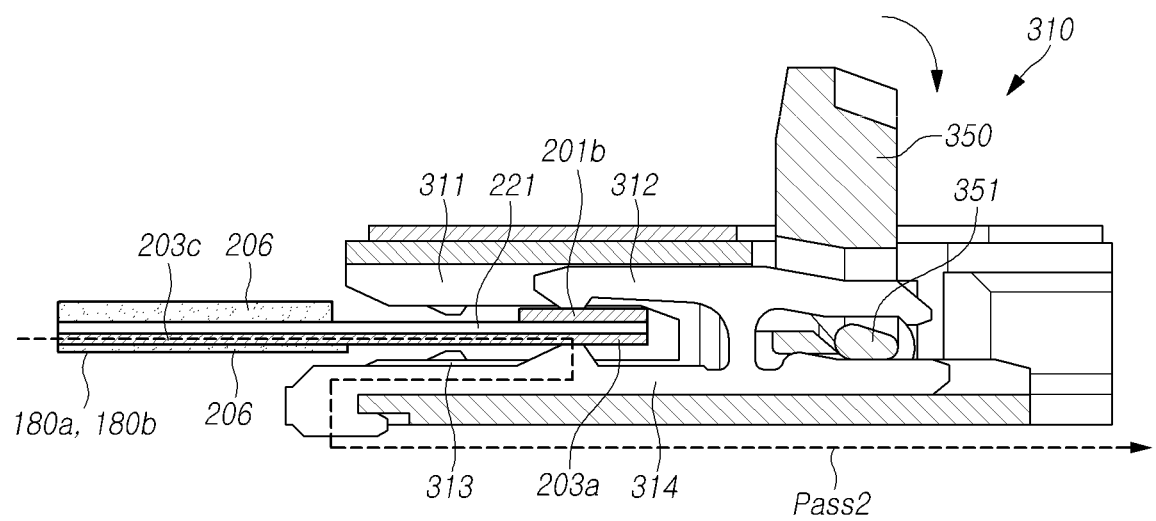
FIG. 12 is a side view illustrating another embodiment in which a source cable is inserted into a connector according to embodiments of the present disclosure.
Figure 13:
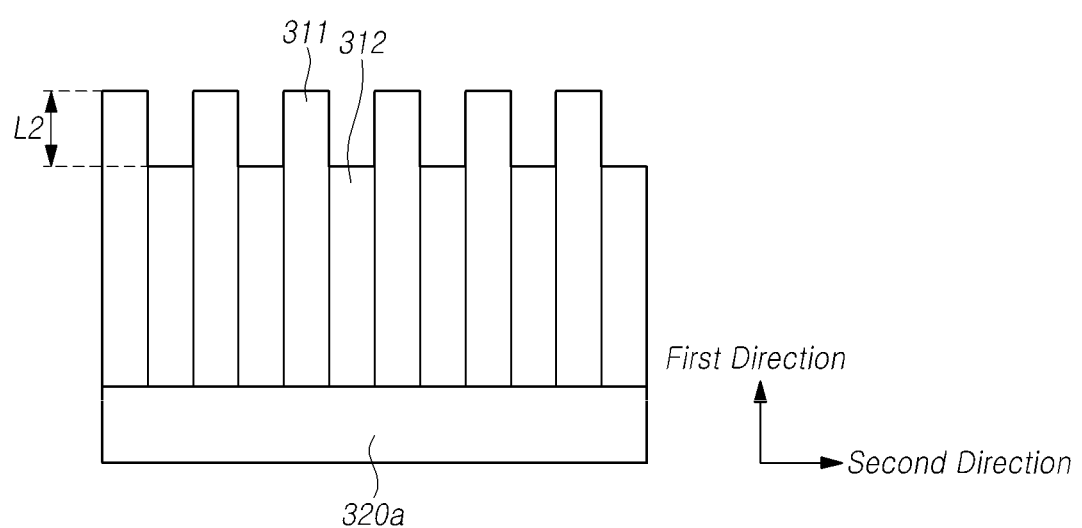
FIG. 13 is a top plan view of a connector according to embodiments of the present disclosure.
Figure 14:
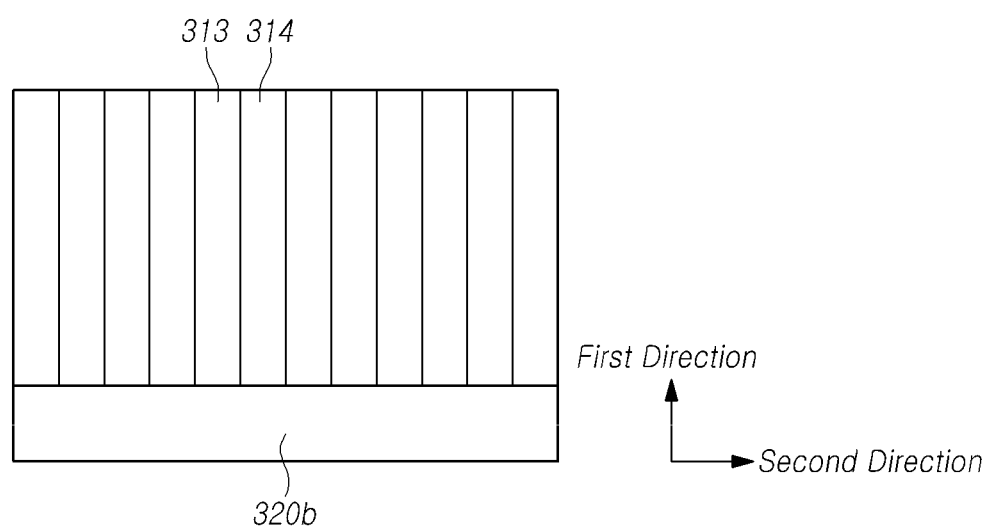
FIG. 14 is a bottom plan view of the connector.
Figure 15:
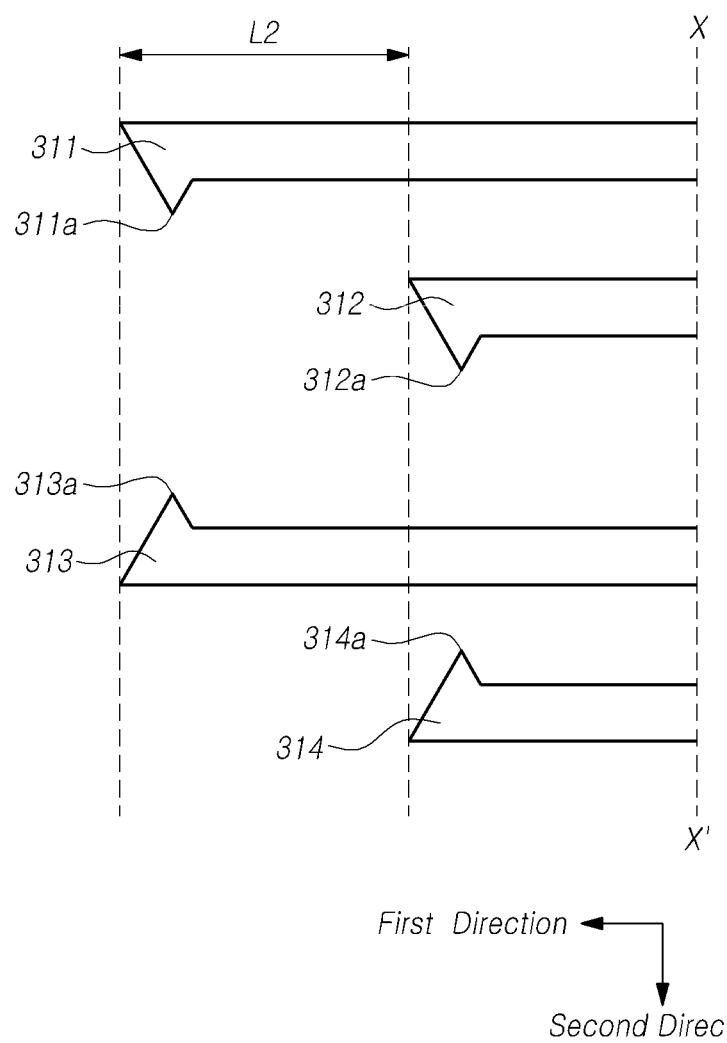
FIG. 15 is a side view illustrating a relationship between connectors according to embodiments of the present disclosure.

FIG. 11 is a side view illustrating one embodiment in which a source cable is inserted into a connector according to embodiments of the present disclosure, FIG. 12 is a side view illustrating another embodiment in which a source cable is inserted into a connector according to embodiments of the present disclosure, FIG. 13 is a top plan view of a connector, and FIG. 14 is a bottom plan view of a connector according to embodiments of the present disclosure. In addition, FIG. 15 is a side view illustrating a relationship between connectors according to embodiments of the present disclosure.

Referring to FIGS. 11 to 15, the connector 310 may include a first body portion 320a (which may be referred to herein as a first body 320a) and a second body portion 320b (which may be referred to herein as a second body 320b), and the first and second bodies 320a, 320b may be separate pieces that are connected to one another or may be integrally formed as a single body piece. The first body 320a and the second body 320b may collectively be referred to as a connector body. The second body 320b may be disposed on the upper face of the first source printed circuit board 130a. In addition, the second body 320b may be disposed on the third pin region 310a disposed on the first source printed circuit board 130a. The connector 310 may include first to fourth electrical contacts 311 to 314. The first electrical contact 311 and the second electrical contact 312 may be disposed on the first body 320a (FIG. 13) and the third electrical contact 313 and the fourth electrical contact 314 may be disposed on the second body 320b (FIG. 14). In addition, the source cable 180a or 180b may be inserted into the connector 310, and the first body 320a and the second body 320b may apply pressure to the source cable 180a or 180b so as to prevent the source cable 180a or 180b from being separated from the connector 310. For example, the first body 320a may apply a downward force from a top side of the source cable 180a or 180b, and the second body 320b may apply an upward force from a bottom side of the source cable 180a or 180b.

FIG. 11 illustrates a state in which the first electric contact 311 and the third electrical contact 313 of the first body 320a and the second body 320b, respectively, fasten the source cable 180a, and FIG. 12 illustrates a state in which the second electrical contact 312 and the fourth electrical contact 314 of the first body 320a and the second body 320b, respectively, fasten the source cable 180a or 180b. In addition, a fixing unit 350 (which may be referred to herein as a rotatable lever 350) may be connected to a connection shaft 351 that connects the first body 320a and the second body 320b. The cross section of the connection shaft 351 may have an elliptical shape. However, the present disclosure is not limited thereto. When the fixing unit 350 rotates clockwise, the connection shaft 351 rotates, and when the connection shaft 351 having the elliptical shape rotates, the interval between the first body 320a and the second body 320b is adjusted. By using this action, when the connection shaft 351 rotates such that the distance between the first electrical contact 311 and the third electrical contact 313 or between the second electrical contact 312 and the fourth electrical contact 314 is reduced, it is possible to apply pressure to the source cable 180a. The fixing unit 350 and the connection shaft 351 may collectively be referred to herein as an adjustable fastening force assembly, which is operable to selectively increase or decrease a fastening force applied by the first and/or second bodies 320a, 320b, for example, by selectively adjusting distances (e.g., in a vertical direction) between the first and third electrical contacts 311, 313 and between the second and fourth electrical contacts 312, 314.

In addition, the first to fourth electrical contacts 311 to 314 may include first to fourth protrusions 311a to 314a (FIG. 15), respectively. In addition, the first electrical contact 311 extends in the first direction, and may include a first protrusion 311a. The second electrical contact 312 is disposed parallel to the first electrical contact 311 in the second direction and extends in the first direction, and may include a second protrusion 312a that protrudes downwards and is disposed at a position closer to a reference line X-X' in the first direction than the first protrusion 311a. The third electrical contact 313 extends in the first direction, and may include a third protrusion 313a that protrudes upwards and corresponds to the first protrusion 311a. In addition, the fourth electrical contact 314 is disposed parallel to the third electrical contacts 313 in the second direction and extends in the first direction, and may include a fourth protrusion 314a that protrudes upwards and corresponds to the second protrusion 312a. The description, "the first protrusion 311a and the third protrusion 313a correspond to each other and the second protrusion 312a and the fourth protrusion 314a correspond to each other" means that the first and second protrusions 311a and 312a and the third and fourth protrusions 313a and 314a are disposed at respective positions where the first and second protrusions 311a and 312a and the third and fourth protrusions 313a and 314a are capable of coming into contact with each other. That is, it means that the first protrusion 311a or the second protrusion 312a is capable of pressing a specific point of the source cable 180a or 180b supported by the third protrusion 313a or the fourth protrusion 314a disposed thereunder. More specifically, the first protrusion 311a may be substantially aligned with the third protrusion 313a (e.g., in a vertical direction), and the second protrusion 312a may be substantially aligned with fourth protrusion 314a (e.g., in the vertical direction). Here, the second direction is a direction parallel to the upper face of the printed circuit board. Each of the first to fourth protrusions 311a to 314a is illustrated as protruding in the second direction. However, this is to illustrate the shapes of the first to fourth protrusions 311a to 314a and an arrangement relationship between the first to fourth protrusions 311a to 314a. That is, the protruding direction of the first to fourth protrusions 311a to 314a may be a direction that is not the second direction but is perpendicular to the second direction. For example, the protruding direction of the first to fourth protrusions 311a to 314a may be a vertical direction, while the second direction may be a horizontal direction.

The first electrical contact 311 may protrude in the first direction to a position that is past an end of the second electrical contact portion 312 by a first length L2, and the first length L2 may correspond to a distance between the positions of the first protrusion 311a and the second protrusion 312a. However, without being limited thereto, the length of the first electrical contact 311 may be the same as the length of the second electrical contact 312, and the positions of the first protrusion 311a and the second protrusion 312a may deviate from each other by the first length L2 from a reference line X-X'. For example, each of the first and second electrical contacts 311, 312 may extend to a same distance from the reference line X-X', while the first protrusion 311a may be provided at a position that is farther in the first direction by the first length L2 than the position of the second protrusion 312a. In addition, the lengths of the third and fourth electrical contacts 313 and 314 may be the same, and the positions of the third and fourth protrusions 313a and 314a may deviate from each other by the first length L2. However, without being limited thereto, the lengths of the third and fourth electrical contacts 313 and 314 may be different from each other by the first length L2 in correspondence with the positions of the third and fourth protrusions 313a and 314a. Here, the reference line X-X' may correspond to the end of the source cable 180a or 180b inserted into the connector 310. However, the present disclosure is not limited thereto.

The first electrical contact 311 may be configured such that the first protrusion 311a abuts and presses the first cable pin 201a from the upper side (FIG. 11), the second electrical contact 312 may be configured such that the second protrusion 312a abuts and presses the first dummy pin 201b from the upper side (FIG. 12), and the third electrical contact 313 may be configured such that the third protrusion 313a abuts and presses the third dummy pin 203b from the lower side, e.g., opposite the first protrusion 311a. In addition, the fourth electrical contact 314 may be configured such that the fourth protrusion 314a abuts and presses the third cable pin 203a from the lower side, e.g., opposite the second protrusion 312a. The first electrical contact 311 may apply a force to the first cable pin 201a from the upper side, and the third electrical contact 313 may apply a force to the third dummy pin 203b from the lower side. In addition, the second electrical contact 312 may apply a force to the first dummy pin 201b from the upper side, and the fourth electrical contact 314 may apply a force to the third cable pin 203a from the lower side. That is, the second electrical contact 312 and the third electrical contact 313 press the source cable 180a or 180b in the same manner as the first electrical contact 311 and the fourth electrical contact 314. The force pressing the source cable 180a or 180b at the second and third electrical contacts 312 and 313 by the dummy pins and the force pressing the source cable 180a or 180b at the first and fourth electrical contacts 311 and 314 are balanced, so that the force with which the connector 310 fastens the source cable 180a or 180b can be increased. Thus, it is possible to prevent the source cable 180a or 180b from being separated from the connector 310, or to reduce the likelihood of the source cable 180a or 180b being inadvertently separated from the connector 310, since the fastening force is increased.

The first protrusion 311a may be electrically connected to the first board pin 501a of the first source printed circuit board 130a. In addition, since the first protrusion 311a is in contact with the first cable pin 201a connected to the first cable signal line 201c, the first board pin 501a of the first source printed circuit board 130a may be electrically connected to the first cable signal line 201c through the first cable pin 201a of the source cable 180a or 180b. Therefore, a first path (Pass1; FIG. 11), through which signals are transmitted, may be formed through the first cable signal line 201c, the first protrusion 311a, the first board pin 501a, and the first board signal line 501b. In addition, the fourth protrusion 314a may be electrically connected to the second board pin 502a of the first source printed circuit board 130a. In addition, since the fourth protrusion 314a is in contact with the third cable pin 203a, which is connected to the third cable signal line 203c, the second board pin 502a of the first source printed circuit board 130a may be electrically connected to the third cable signal line 203c through the third cable pin 203a of the source cable 180a or 180b. Therefore, a second path (Pass2; FIG. 12), through which signals are transmitted, may be formed through the third cable signal line 203c, the fourth protrusion 314a, the second board pin 502a, and the second board signal line 502b.

In addition, an electrical contact, which is located adjacent to the second electrical contact 312, which is located adjacent to the first electrical contact 311 in the second direction, may be a fifth electrical contact, and an electrical contact, which is located adjacent to the fifth electrical contact, may be a sixth electrical contact. The protrusion provided on the fifth electrical contact may be connected to the third board pin 503a of the first source printed circuit board 130a.

In addition, an electrical contact, which is located adjacent to the fourth electrical contact 314, which is located adjacent to the third contact 313 in the second direction, may be a seventh electrical contact, and an electrical contact, which is located adjacent to the seventh electrical contact, may be an eighth electrical contact. The protrusion provided on the eighth contact may be connected to the fourth board pin 504a of the first source printed circuit board 130a.

The cable pins disposed on the upper and lower sides of the source cable 180a or 180b may be connected to the pins disposed on the first source printed circuit board 130a through the connector 310. However, the connection between the cable pins of the source cable 180a or 180b and the board pins of the first source printed circuit board 130a is not limited thereto.

Although the electrical contacts connected to the first body 320a and the second body 320b are illustrated as being separable from each other, the electrical contacts portions are not limited thereto. The electrical contacts corresponding to the first body 320a and the electrical contacts corresponding to the second body 320b may be integrally formed.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
   a cable, the cable including:
      a film having a first pin region and a first dummy pin region adjacent to one another on a first face of the film, and a second pin region and a second dummy pin region adjacent to one another on a second face of the film opposite the first face, the second pin region overlapping the first dummy pin region and the second dummy pin region overlapping the first pin region;
      a first cable pin and a second cable pin spaced apart from one another in the first pin region;
      a third cable pin and a fourth cable pin spaced apart from one another in the second pin region;
      a first cable signal line on the first face of the film and connected to the first cable pin, and a second cable signal line on the first face of the film and connected to the second cable pin; and a third cable signal line on the second face of the film and connected to the third cable pin, and a fourth cable signal line on the second face of the film and connected to the fourth cable pin.

2. The display device of claim 1, wherein the film further comprises:
   a first dummy pin and a second dummy pin disposed in the first dummy pin region at positions overlapping the third cable pin and the fourth cable pin, respectively; and
   a third dummy pin and a fourth dummy pin disposed in the second dummy pin region at positions overlapping the first cable pin and the second cable pin, respectively.

3. The display device of claim 2, wherein a distance between the first cable signal line and the second cable signal line is different than a width of the first dummy pin.

4. The display device of claim 1, wherein one of the first cable signal line and the second cable signal line is applied with a positive signal and a remaining one thereof is applied with a negative signal, and wherein one of the third cable signal line and the fourth cable signal line is applied with a positive signal and a remaining one thereof is applied with a negative signal.

5. The display device of claim 1, wherein the first pin region, the first dummy pin region, the second pin region, and the second dummy pin region are positioned adjacent to a first end of the film.

6. The display device of claim 5, wherein the cable comprises a flexible flat cable.

7. The display device of claim 1, wherein a first distance between the first cable signal line and the second cable signal line outside of the first pin region is less than a second distance between the first cable pin and the second cable pin in the first pin region.

8. The display device of claim 7, wherein first segments of each of the first cable signal line and the second cable signal line extend along a first direction from the first cable pin and the second cable pin, respectively, second segments of each of the first cable signal line and the second cable signal line extend along the first direction toward one another from the respective first segments of the first cable signal line and the second cable signal line, and third segments of each of the first cable signal line and the second cable signal line respectively extend from the respective second segments of the first cable signal line and the second cable signal line along the first direction, the third segments of the first cable signal line and the second cable signal line being spaced apart from one another by the first distance.

9. The display device of claim 1, further comprising:
   a display panel;
   a first printed circuit board disposed on a first side of the display panel; and
   a second printed circuit board disposed on the first side of the display panel, the cable being connected to the first and the second printed circuit boards.

10. The display device of claim 9, wherein the first printed circuit board or the second printed circuit board is one of a bridge printed circuit board, a control printed circuit board, or a source printed circuit board.

11. The display device of claim 9, further comprising:
    a connector on the first printed circuit board, the connector being connected to the cable,
    wherein the connector comprises:
       a connector body;
       a first electrical contact extending from the connector body and including a first protrusion that protrudes downwards;
       a second electrical contact extending from the connector body, the second electrical contact being adjacent to the first electrical contact, the second electrical contact including a second protrusion that protrudes downwards and is spaced apart from the connector body in a first direction by a distance that is less than a distance between the first protrusion and the connector body in the first direction;
       a third electrical contact extending from the connector body and including a third protrusion that protrudes upwards at a position that corresponds to a position of the first protrusion; and
       a fourth electrical contact extending from the connector body, the fourth electrical contact being adjacent to the third electrical contact, the fourth electrical contact including a fourth protrusion that protrudes upward at a position that corresponds to a position of the second protrusion.

12. The display device of claim 11, wherein at least one of the first printed circuit board or the second printed circuit board includes:
    a board pin region disposed on a body of the at least one of the first printed circuit board or the second printed circuit board; and
    a plurality of board pins disposed in the board pin region and spaced apart from one another, the plurality of board pins including a first board pin and a second board pin, wherein the first board pin is connected to a first board signal line, the second board pin is connected to a second board signal line, and the first board signal line extends from the first board pin in a direction that is different from a direction from which the second board signal line extends from the second board pin.

13. The display device of claim 12, wherein the second board signal line extends between the second board pin and a conductive via in the printed circuit board body, the second board signal line being electrically connected to the conductive via.

14. The display device of claim 12, wherein, in use, the first board pin transmits a signal having a first polarity, and the second board pin transmits a signal having a second polarity that is opposite the first polarity.

15. The display device of claim 12, wherein the first protrusion is electrically connected to the first board signal line and the fourth protrusion is electrically connected to the second board signal line.

16. The display device of claim 11, wherein each of the first printed circuit board and the second printed circuit board respectively includes:
    a board region disposed on a printed circuit board body; and
    a plurality of board pins disposed in the board pin region and spaced apart from one another, the plurality of board pins including a first board pin and a second board pin,
    wherein the first board pin is connected to a first board signal line, the second board pin is connected to a second board signal line, and the first board signal line extends from the first board pin in a direction that is different from a direction from which the second board signal line extends from the second board pin.

17. The display device of claim 16, wherein, in use, the first board pins of the first printed circuit board and the second printed circuit board transmit respective signals having a first polarity, and the second board pins of the first printed circuit board and the second printed circuit board transmit respective signals having a second polarity that is opposite the first polarity.

* * * * *